(12) United States Patent
Zhang et al.

(10) Patent No.: US 12,322,596 B2
(45) Date of Patent: Jun. 3, 2025

(54) METHODS FOR THERMAL TREATMENT OF A SEMICONDUCTOR LAYER IN SEMICONDUCTOR DEVICE

(71) Applicant: YANGTZE MEMORY TECHNOLOGIES CO., LTD., Wuhan (CN)

(72) Inventors: Kun Zhang, Wuhan (CN); Lei Liu, Wuhan (CN); Yuancheng Yang, Wuhan (CN); Wenxi Zhou, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 750 days.

(21) Appl. No.: 17/539,677

(22) Filed: Dec. 1, 2021

(65) Prior Publication Data
US 2023/0138575 A1 May 4, 2023

Related U.S. Application Data

(63) Continuation of application No. PCT/CN2021/127750, filed on Oct. 30, 2021.

(51) Int. Cl.
*H01L 21/02* (2006.01)
*H01L 21/67* (2006.01)

(52) U.S. Cl.
CPC .. *H01L 21/02678* (2013.01); *H01L 21/02691* (2013.01); *H01L 21/67115* (2013.01)

(58) Field of Classification Search
CPC ......... H01L 21/02678; H01L 21/02691; H01L 21/67115; H01L 21/02532; B23K 26/0622; B23K 26/0626; B23K 26/0676; B23K 26/352; B23K 26/082; B23K 2101/40; B23K 2103/56; H10B 43/40
USPC .......................................................... 348/795
See application file for complete search history.

(56) References Cited

U.S. PATENT DOCUMENTS

| | | | | |
|---|---|---|---|---|
| 6,437,284 | B1 * | 8/2002 | Okamoto | B23K 26/0732 219/121.73 |
| 7,615,424 | B2 * | 11/2009 | Tanaka | B23K 26/04 438/795 |
| 2004/0097103 | A1 * | 5/2004 | Imai | H01L 21/02686 438/795 |
| 2004/0106244 | A1 * | 6/2004 | Kim | H10D 30/6745 257/E29.292 |
| 2004/0227184 | A1 * | 11/2004 | Kobori | H10D 86/0229 257/353 |

(Continued)

OTHER PUBLICATIONS

International Search Report issued in corresponding International Application No. PCT/CN2021/127750, mailed Jun. 24, 2022, 4 pages.

*Primary Examiner* — Jami Valentine Miller
*Assistant Examiner* — Pratiksha Jayant Lohakare
(74) *Attorney, Agent, or Firm* — BAYES PLLC

(57) ABSTRACT

Methods for thermal treatment on a semiconductor device is disclosed. One method includes obtaining a pattern of a treatment area having amorphous silicon, aligning a laser beam with the treatment area, the laser beam in a focused laser spot having a spot area equal to or greater than the treatment area, and performing a laser anneal on the treatment area by emitting the laser beam towards the treatment area for a treatment period.

20 Claims, 12 Drawing Sheets

(56) References Cited

U.S. PATENT DOCUMENTS

| | | | |
|---|---|---|---|
| 2005/0167662 A1* | 8/2005 | Nakamura | H10D 86/40 257/E27.111 |
| 2005/0282406 A1* | 12/2005 | Bruland | B23K 26/067 438/795 |
| 2007/0196576 A1* | 8/2007 | Kim | C23C 16/56 257/E29.295 |
| 2008/0124816 A1* | 5/2008 | Bruland | B23K 26/082 257/E23.15 |
| 2013/0094534 A1 | 4/2013 | Okumura | |
| 2019/0181009 A1 | 6/2019 | Rumsby et al. | |
| 2019/0304782 A1 | 10/2019 | Gao et al. | |
| 2019/0311899 A1 | 10/2019 | Mizumura | |

* cited by examiner

METHODS FOR THERMAL TREATMENT OF A SEMICONDUCTOR LAYER IN SEMICONDUCTOR DEVICE

CROSS-REFERENCE TO RELATED APPLICATIONS

This application is continuation of International Application No. PCT/CN2021/127750, filed on Oct. 30, 2021, entitled "METHODS FOR THERMAL TREATMENT OF A SEMICONDUCTOR LAYER IN SEMICONDUCTOR DEVICE," which is hereby incorporated by reference in its entirety.

BACKGROUND

The present disclosure relates to semiconductor fabrication methods.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

A method for thermal treatment on a semiconductor device is disclosed. The method includes obtaining a pattern of a treatment area having amorphous silicon, aligning a laser beam with the treatment area, the laser beam in a focused laser spot having a spot area equal to or greater than the treatment area, and performing a laser anneal on the treatment area by emitting the laser beam towards the treatment area for a treatment period.

Another method for thermal treatment on a semiconductor device is provided. The method includes obtaining a pattern of a treatment area having amorphous silicon, and aligning a plurality of laser beams with the treatment area. The laser beams are each in a focused laser spot having a plurality of spot areas each less than or equal to a treatment area. The method also includes performing a laser anneal on the treatment area by emitting the plurality of laser beams towards the treatment area for a treatment periods to convert the amorphous silicon to polysilicon.

A system for thermal treatment on a semiconductor device is disclosed. The system includes a laser source configured to generate one or more laser beams, an optical module configured to provide one or more focused laser spots on a treatment area, and a controller coupled to the optical module. The controller is configured to (i) obtain dimensions of the treatment area, and (ii) control at least the optical module to perform a laser anneal on the treatment area by applying the one or more focused laser spots on treatment area based on a spot area of each of the focused laser spots and the treatment area.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1:
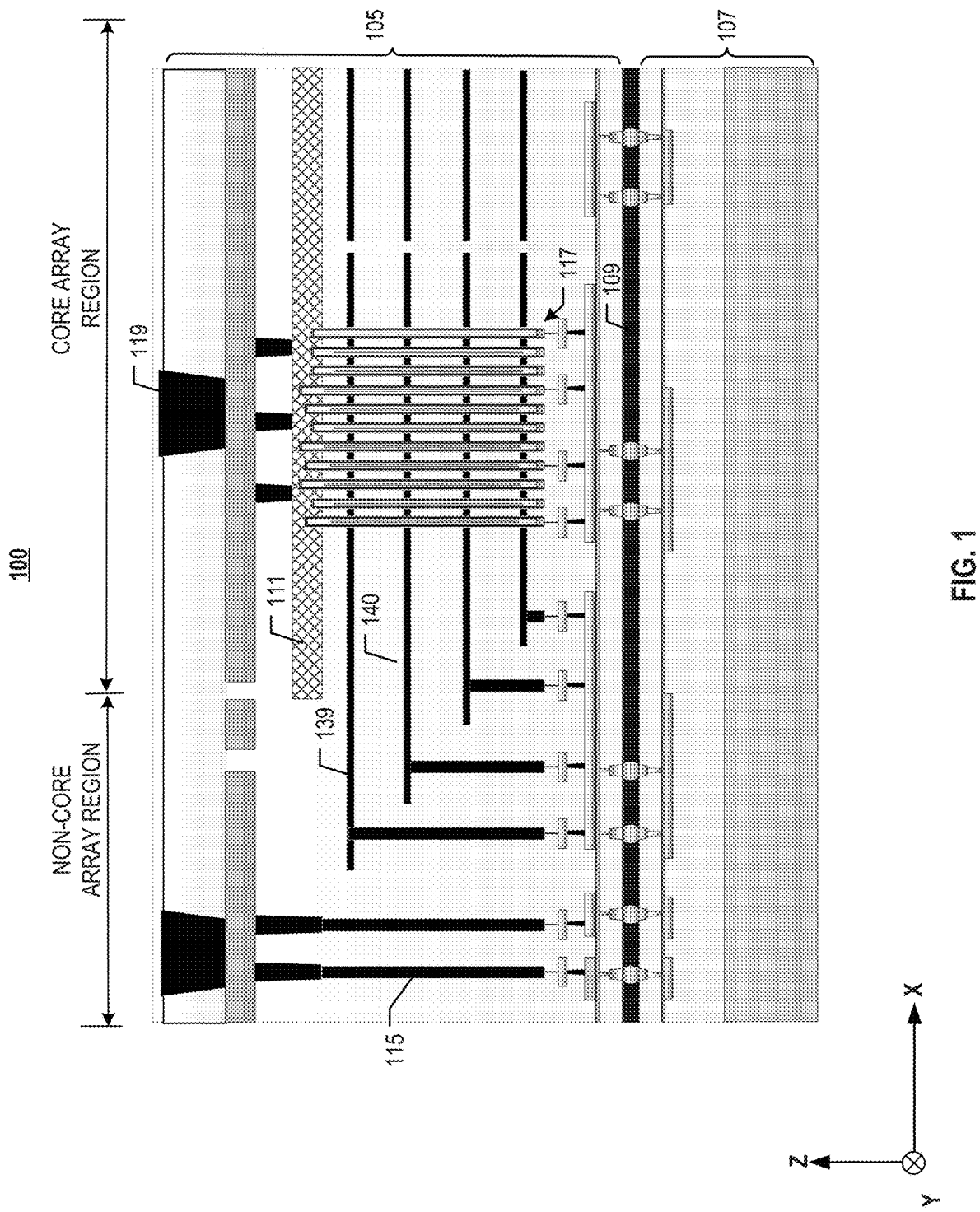
FIG. 1 illustrates a cross-sectional view of a 3D memory device, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

In a 3D memory devices, peripheral circuits and memory cell arrays of a memory device are disposed in different planes (levels, tiers) in the vertical direction, i.e., stacked over one another, to reduce the planar chip size of the peripheral circuits, as well as the total chip size of the memory device. In the 3D memory devices, the memory cells are formed by the intersections of NAND memory strings and word lines. The NAND memory strings are formed extending vertically in the memory stack (e.g., conductive/dielectric layer pairs), and source ends of the NAND memory strings are in contact with a semiconductor layer that functions as part of a source contact for applying a source voltage on the NAND memory strings. The semiconductor layer is then conductively connected to pad-out interconnect(s) for pad-out purposes.

The formation of the semiconductor layer often includes a thermal treatment that converts the amorphous silicon, deposited in a treatment area and in contact with the source ends of the NAND memory strings, into polysilicon. The thermal treatment can also activate implants embedded in the amorphous silicon for electrical connection. To avoid affecting the metal structures (e.g., bonding contacts, interconnects, etc.) and maintain reliability of these metal structures, a local thermal treatment, such as a laser anneal, is used for the local thermal treatment. However, the thermal treatment is often not accommodated for treatment areas of various sizes, layouts, and locations. It is thus challenging to anneal 3D memory devices having semiconductor layers of different sizes/dimensions with uniform laser energy.

To address one or more of the aforementioned issues, the present disclosure provides methods and a system to convert amorphous silicon to polysilicon to form a semiconductor layer in a semiconductor device. The semiconductor layer can have any suitable functions and/or locations. In some implementations, the semiconductor layer is conductively connected to a pad-out interconnect in the semiconductor device for pad-out purposes. In the present disclosure, the treatment area, in which the amorphous silicon is located, can have any suitable dimensions. A laser anneal is used for the conversion. To accommodate treatment area of various sizes/areas, the focused laser spots of the laser beams used to treat the treatment area can be adjusted such that the energy of the laser beam(s) incident on the entire treatment area is constant/uniform. The energy level incident on the treatment area (e.g., amorphous silicon) is sufficiently high to facilitate annealing and implant activation. For example, based on the size/area of the treatment area, the energy profile and/or the number of laser beams incident on the treatment area can be adjusted to form a spot/area of uniform energy, which can be applied to the treatment area. In an example, if the spot area of a single focused laser spot is greater than or equal to the treatment area, the single focused laser spot may be used to treat the entire treatment area. If the spot area of a focused laser spot is less than or equal to the treatment area, a plurality of focused laser spots can be employed to form a minimum repeating spot. The minimum repeating spot, having uniform energy, may be applied to cover the entire treatment area. The methods and system of the present disclosure can thus simplify the fabrication of the semiconductor layer, allowing the laser anneal to be more scalable. For example, mass production of semiconductor devices with semiconductor layers can be easier, and the control of the laser anneal can be simplified.

FIG. 1 illustrates a side view of part of an exemplary 3D memory device 100, according to the present disclosure. 3D memory device includes a first semiconductor structure 105 and a second semiconductor structure 107, bonded with each other at a boding interface 109. 3D memory device 100 may include a core array region and a non-core array region. First semiconductor structure 105 includes a plurality of NAND memory strings 117, a plurality of interleaved gate conductive layers 139 and dielectric layers 140, a plurality of contact structures 115, a semiconductor layer 111, and a plurality of pad-out interconnects 119. Source ends of NAND memory strings 117, located in a core array region, are in contact with semiconductor layer 111. Contact structures 115, e.g., through-silicon vias (TSVs) may be located in a non-array region and insulated from semiconductor layer 111. Pad-out interconnects 119 may be conductively connected to semiconductor layer 111 for pad-out purposes.

It is noted that x-, y-, and z-axes are added in the figures of the present disclosure to further illustrate the spatial relationships of the components of a semiconductor device. A substrate of a semiconductor device, e.g., 3D memory device 100, includes two lateral surfaces (e.g., a top surface and a bottom surface) extending laterally in the x-direction and y-direction (the lateral directions or width directions). The x-direction is the word line direction of 3D memory device 100, the y-direction is the bit line direction of 3D memory device 100, and the z-direction is perpendicular to the x-y plane. In some implementations, the z-direction is the NAND direction in which the NAND memory strings extend vertically. As used herein, whether one component (e.g., a layer or a device) is "on," "above," or "below" another component (e.g., a layer or a device) of a semiconductor device is determined relative to the substrate of the semiconductor device in the z-direction (the vertical direction or thickness direction) when the substrate is positioned in the lowest plane of the semiconductor device in the z-direction. The same notion for describing the spatial relationships is applied throughout the present disclosure.

As shown in FIG. 1, first and second semiconductor structures 105 and 107 may be bonded to each other in a face-to-face manner at bonding interface 109. Second semiconductor structure 107 can include a substrate and a device layer above and in contact with the substrate. The substrate can include silicon (e.g., single crystalline silicon, c-silicon), silicon germanium (SiGe), gallium arsenide (GaAs), germanium (Ge), silicon on insulator (SOI), germanium on insulator (GOI), or any other suitable semiconductor materials. In some implementations, the substrate includes single crystalline silicon. In some implementations, the device layer includes a peripheral circuit (details not shown in the figures). The peripheral circuit can include high voltage (HV) circuits, such as driving circuits, and low voltage (LV) circuits, such as page buffer circuits and logic circuits. In some implementations, the peripheral circuit includes a plurality of transistors in contact with the substrate. The transistors can include any transistors disclosed herein, such as planar transistors and 3D transistors. In some implementations, second semiconductor structure 107 further includes an interconnect layer above the device layer to transfer electrical signals to and from the peripheral circuit in the device layer. The interconnect layer can include a plurality of interconnects, including lateral lines and vias. As used herein, the term "interconnects" can broadly include any suitable types of interconnects, such as middle-end-of-line (MEOL) interconnects and back-end-of-line (BEOL) interconnects. Interconnects can be coupled to the transistors of the peripheral circuit in the device layer. The interconnect layer can further include one or more interlayer dielectric (ILD) layers (also known as "intermetal dielectric (IMD) layers") in which the lateral lines and vias can form. That is, the interconnect layer can include lateral lines and vias in multiple ILD layers. In some implementations, the devices in the device layer are coupled to one another through the interconnects in the interconnect layer. The interconnects in the interconnect layer can include conductive materials including, but not limited to, W, Co, Cu, Al, silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof. In some implementations, the interconnects in the interconnect layer include W, which has a relatively high thermal budget (compatible with high-temperature processes) and good quality (fewer detects, e.g., voids) among conductive metal materials.

As shown in FIG. 1, second semiconductor structure 107 can further include a bonding layer at bonding interface 109 and above and in contact with the interconnect layer. The bonding layer can include a plurality of bonding contacts and dielectrics electrically isolating the bonding contacts. The bonding contacts can include conductive materials including, but not limited to, W, Co, Cu, Al, silicides, or any combination thereof. In some implementations, the bonding contacts of the bonding layer include Cu. The remaining area of the bonding layer can be formed with dielectrics including, but not limited to, silicon oxide, silicon nitride, silicon oxynitride, low-k dielectrics, or any combination thereof. The bonding contacts and surrounding dielectrics in the bonding layer can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously. For example, the bonding interface may be distinguished based on the relative positions, e.g., shifts, of the bonded contacts.

As shown in FIG. 1, first semiconductor structure 105 can further include a bonding layer at bonding interface 109, e.g., on the opposite side of the bonding interface with respect to the bonding layer in second semiconductor structure 107. The bonding layer of first semiconductor structure 105 can include a plurality of bonding contacts and dielectrics electrically isolating the bonding contacts. The bonding contacts can include conductive materials, such as Cu. The remaining area of the bonding layer can be formed with dielectric materials, such as silicon oxide. The bonding contacts and surrounding dielectrics in the bonding layer can be used for hybrid bonding. In some implementations, bonding interface 109 is the place at which the bonding layers of first and second semiconductor structures 105 and 107 are met and bonded.

First semiconductor structure 105 can further include an interconnect layer above and in contact with the bonding layer (of the first semiconductor structure 105) to transfer electrical signals. The interconnect layer in first semiconductor structure 105 can include a plurality of interconnects, such as MEOL interconnects and BEOL interconnects. In some implementations, the interconnects in the interconnect layer also include local interconnects, such as bit line contacts and word line contacts. The interconnect layer can further include one or more ILD layers in which the lateral lines and vias can form. The interconnects in the interconnect layer can include conductive materials including, but not limited to, W, Co, Cu, Al, silicides, or any combination thereof. The ILD layers in the interconnect layer and include dielectric materials including, but not limited to, silicon oxide, silicon nitride, silicon oxynitride, low-k dielectrics, or any combination thereof.

As shown in FIG. 1, first semiconductor structure 105 can include a memory cell array, such as an array of NAND memory strings 117 above and in contact with the interconnect layer. NAND memory strings 117 (e.g., the memory cell array) may be formed in the core array region. Each NAND memory string 117 extends vertically through a plurality of pairs of gate conductive layer 139 and dielectric layer 140, according to some implementations. The stacked and interleaved gate conductive layers 139 and dielectric layers 140 are also referred to herein as a stack structure, e.g., a memory stack of conductive/dielectric layer pairs. The interleaved gate conductive layers 139 and dielectric layers 140 in the memory stack alternate in the vertical direction, according to some implementations. Each gate conductive layer 139 can include a gate electrode (gate line) surrounded by an adhesive layer and a gate dielectric layer. The adhesive layer can include conductive materials, such as titanium nitride (TiN), which can improve the adhesiveness between the gate electrode and the gate dielectric layer. The gate electrode of gate conductive layer 139 can extend laterally as a word line, ending at one or more staircase structures of the memory stack The staircase structures are located in a staircase region, which is part of the non-core array region. The staircase structures may be in contact with a plurality of word line contacts for applying voltages on gate conductive layers 139.

The number of the pairs of gate conductive layers 139 and dielectric layers 140 in the memory stack can be one of the factors that determine the number of memory cells in the memory cell array. Gate conductive layer 139 can include conductive materials including, but not limited to, tungsten (W), cobalt (Co), copper (Cu), aluminum (Al), polysilicon, doped silicon, silicides, or any combination thereof. In some implementations, each gate conductive layer 139 includes a metal layer, such as a tungsten layer. In some implementations, each gate conductive layer 139 includes a doped polysilicon layer. Each gate conductive layer 139 can include control gates surrounding the memory cells. Dielectric layers 140 can include dielectric materials including, but not limited by, silicon oxide, silicon nitride, silicon oxynitride, or a combination thereof. In some implementations, dielectric layers 140 include silicon nitride.

As shown in FIG. 1, each NAND memory string 117 includes a channel structure extending vertically through the memory stack. In some implementations, the channel structure includes a channel hole filled with semiconductor material(s) (e.g., as a semiconductor channel) and dielectric material(s) (e.g., as a memory film). In some implementations, the semiconductor channel includes silicon, such as polysilicon. In some implementations, the memory film is a composite dielectric layer including a tunneling layer, a storage layer (also known as a "charge trap/storage layer"), and a blocking layer. The channel structure can have a cylinder shape (e.g., a pillar shape). The semiconductor channel, the tunneling layer, the storage layer, the blocking layer are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the memory film may include a composite layer of silicon oxide/silicon oxynitride/silicon oxide (ONO). The channel structure can further include a channel plug on the drain end of NAND memory string 117. The channel plug can include polysilicon and be in contact with the semiconductor channel. In some implementations, each NAND memory string 117 is a "charge trap" type of NAND memory. It is understood that NAND memory strings 117 are not limited to the "charge trap" type of NAND memory strings and may be "floating gate" type of NAND memory strings in other examples.

NAND memory string 117 is free of any semiconductor plug on the source end thereof, according to some implementations. Instead, 3D memory device 100 includes a semiconductor layer 111 above and in contact with NAND memory strings 117. Semiconductor layer 111 can be in contact with the sidewall of the semiconductor channel of the channel structure at the source end of each NAND memory strings 117. Semiconductor layer 111 can include semiconductor materials, such as doped polysilicon. In some implementations, semiconductor layer 111 is doped with N-type dopants such as phosphorus and/or arsenic. The thickness of semiconductor layer 111 may be in a range of 100 nm to 600 nm. In some implementations, semiconductor layer 111 and a source contact in a slit structure (e.g., array common source "ACS," not shown) may collectively function as parts of a source line (not shown) coupled to the source ends of NAND memory string 117, for example, for applying an erase voltage to the source ends of NAND memory string 117 during erase operations.

Semiconductor layer 111 may be located, fully or partially, in the core array region. An area of semiconductor layer 111 may be sufficiently large, e.g., larger than or equal to the total area in which all NAND memory strings 117 are formed, to be in contact with the source ends of all NAND memory strings 117. In various implementations, semiconductor layer 111 may or may extend to the non-core array region (e.g., the staircase region). The specific area/dimension of semiconductor layer 111 should not be limited by the implementations of the present disclosure.

As shown in FIG. 1, first semiconductor structure 105 can further include one or more contact structures 115 extending vertically in 3D memory device 100. In some implementations, contact structures 115 couples the interconnects in the interconnect layers to pad-out interconnects 119 to facilitate electrical connections in 3D memory device 100. Contact structures 115 can include conductive materials including, but not limited to, W, Co, Cu, Al, silicides, or any combination thereof. In some implementations, contact structures 115 include W. In some implementations, contact structures 115 each may be a TSV having a depth, e.g., length along the z-direction, in the micron- or tens micron-level (e.g., between 1 μm and 100 μm).

As shown in FIG. 1, first semiconductor structure 105 can further include a pad-out interconnect layer above and conductively connected to semiconductor layer 111. In some implementations, semiconductor layer 111 is disposed vertically, in the z-direction, between the pad-out interconnect layer and NAND memory strings 117. The pad-out interconnect layer can include one or more insulating layers above semiconductor layer 111 and a plurality of pad-out interconnects 119 conductively connected to semiconductor layer 111 and/or contact structures 115. In some implementations, the pad-out interconnect layer includes a plurality of contacts above and in contact with semiconductor layer 111 and/or one or more contact layers above and in contact with the contacts and pad-out interconnects 119. In some implementations, pad-out interconnects 119 conductively connected to contact structures 115 are employed to drive the transistors in the peripheral circuit in the device layer. In some implementations, pad-out interconnects 119 conductively connected to NAND memory strings 117 are employed to provide voltages for operations of the memory cells such as erase, write, and read. The contacts, the contact layers, and pad-out interconnects 119 may each include tungsten (W), cobalt (Co), copper (Cu), aluminum (Al), polysilicon, doped silicon, silicides, or any combination thereof. In some implementations, the contacts, the contact layers, and pad-out interconnects 119 may each include tungsten. The one or more insulating layers may include silicon oxide, silicon nitride, silicon oxynitride, or a combination thereof.

3D memory device 100 can be formed by forming a semiconductor layer over a semiconductor structure, and forming pad-out interconnects conductively connected to the semiconductor layer. As shown in FIG. 1, a semiconductor structure, having a core array region and a non-core array region can first be formed. The semiconductor structure may include part of first semiconductor structure 105 bonded with second semiconductor structure 107 at bonding interface 109. Second semiconductor structure may include the substrate, the device layer, the respective interconnect layer, and the respective bonding layer. The part of first semiconductor structure 105 may include the respective bonding layer, the respective interconnect layer, and the memory stack. The memory stack may include interleaved a plurality of gate conductive layers 139 and a plurality of dielectric layers 140. The memory stack may also include the array of NAND memory strings 117 extending in the interleaved gate conductive layers 139 and dielectric layers 140. The part of first semiconductor structure 105 may also include one or more first contact portions extending vertically and coupled to the respective interconnect layer. The first contact portion may subsequently form a lower part of a contact structure 115 (e.g., a TSV). NAND memory strings 117 may be located in the core array region, and the first contact portions may be located in the non-core array region.

To form the part of first semiconductor structure 105, a stack structure, such as a memory stack including interleaved gate conductive layers and dielectric layers, is formed on a first substrate. To form the memory stack, in some implementations, a dielectric stack (not shown) including interleaved sacrificial layers (not shown) and the dielectric layers is formed on a first substrate, which may include silicon. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, chemical vapor deposition (CVD), physical vapor deposition (PVD), atomic layer deposition (ALD), or any combination thereof. The dielectric stack may be repeatedly patterned to form a plurality of stairs in the non-core array region. The memory stack can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that the memory stack may also be formed by alternatingly depositing conductive layers (e.g., doped polysilicon layers) and dielectric layers (e.g., silicon oxide layers) without the gate replacement process in some examples. In some implementations, a pad oxide layer (e.g., thermally grown local oxidation of silicon (LOCOS)), including silicon oxide, is formed between the memory stack and the first substrate. A plurality of contact vias may be formed extending vertically and landed on the stairs to form electrical connections between gate conductive layers 139 and the respective interconnect layer that is to be formed.

NAND memory strings 117 may be formed above the first substrate. Each NAND memory string 117 extends vertically through the dielectric stack (or the memory stack, depending on the fabrication process) to be in contact with the first substrate. In some implementations, the fabrication processes to form NAND memory string 117 include forming a channel hole through the dielectric stack (or the memory stack) and into the first substrate using dry etching/and or wet etching, such as deep reactive-ion etching (DRIE), followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof.

In some implementations, the interconnect layer of first semiconductor structure 105 is formed above the array of NAND memory strings 117 on the first substrate. The interconnect layer can include a plurality of interconnects in one or more ILD layers. The interconnects may be conductively connected to NAND memory strings 117. The interconnects in the interconnect layer can include conductive materials deposited by one or more thin film deposition processes including, but not limited to, CVD, PVD, ALD, electroplating, electroless plating, or any combination thereof. Fabrication processes to form interconnects can also include photolithography, chemical mechanical polishing (CMP), wet/dry etch, or any other suitable processes. The ILD layers can include dielectric materials deposited by one or more thin film deposition processes including, but not limited to, CVD, PVD, ALD, or any combination thereof. In some implementations, the interconnects in the interconnect layer include W, which has a relatively high thermal budget among conductive metal materials to sustain later high-temperature processes.

In some implementations, the bonding layer of first semiconductor structure 105 is formed above the respective interconnect layer. The bonding layer can include a plurality of bonding contacts surrounded by dielectrics in a dielectric layer. The dielectrics can be formed by one or more thin film deposition processes including, but not limited to, CVD, PVD, ALD, or any combination thereof. The bonding contacts can then be formed through the dielectric layer and in contact with the interconnects in the interconnect layer by patterning the dielectric layer (e.g., photolithography and dry/wet etch of dielectric materials in the dielectric layer) and filling the contact holes by depositing an adhesion (glue) layer, a barrier layer, and/or a seed layer and a conductive material, e.g., W. The deposition of the conductive material may include CVD, PVD, ALD, electroplating, electroless plating, or any combination thereof.

To form second semiconductor structure 107, the device layer is formed on the substrate (e.g., a second substrate). The device layer may include a plurality of transistors on the substrate. The substrate can be a silicon substrate having single crystalline silicon. The transistors can be formed by a plurality of processes including, but not limited to, photolithography, dry/wet etch, thin film deposition, thermal growth, implantation, CMP, and any other suitable processes. In some implementations, doped regions are formed in the substrate by ion implantation and/or thermal diffusion, which function, for example, as wells and source/drain regions of the transistors. In some implementations, isolation regions (e.g., shallow trench isolation (STIs)) are also formed in the substrate by wet/dry etch and thin film deposition. The transistors may function as part or all of the peripheral circuits for controlling NAND memory strings 117. It is understood that the details of fabricating transistors may vary depending on the types of the transistors and thus, are not elaborated for ease of description.

In some implementations, the interconnect layer of second semiconductor structure 107 is formed above the transistors on the substrate. The formation of the interconnect layer of second semiconductor structure 107 may be similar to that of first semiconductor structure 105, and is not repeated herein. In some implementations, the first contact portions may be formed, in the non-core array region and coupled to interconnects in the respective interconnect layer of the second semiconductor structure 107. The formation of the first contact portions may include photolithography, etching, and deposition. For example, the first contact portions can include conductive materials deposited by one or more thin film deposition processes including, but not limited to, CVD, PVD, ALD, electroplating, electroless plating, or any combination thereof.

In some implementations, the bonding layer of second semiconductor structure 107 is formed above the respective interconnect layer. The bonding layer can include a plurality of bonding contacts surrounded by dielectrics in a dielectric layer. The formation of the bonding layer of second semiconductor structure 107 may be similar to that of first semiconductor structure 105 and is not repeated herein.

As illustrated in FIG. 1, the part of first semiconductor structure 105 (e.g., the memory stack and NAND memory strings 117 formed therethrough) is flipped upside down. The bonding layer of first semiconductor structure 105 is facing down is bonded with the bonding layer of second semiconductor structure 107 facing up, i.e., in a face-to-face manner, thereby forming bonding interface 109. That is, the bonding contacts in the two bonding layers are bonded at bonding interface 109. In some implementations, a treatment process, e.g., plasma treatment, wet treatment and/or local thermal treatment, is applied to bonding surfaces prior to bonding. As a result of the bonding, e.g., hybrid bonding, the bonding contacts on opposite sides of bonding interface 109 can be inter-mixed. After the bonding, the bonding contacts of first and second semiconductor structures 105 and 107 are aligned and in contact with one another, such that the memory stack and NAND memory strings 117 formed therethrough can be coupled to the transistors through the bonded bonding contacts across bonding interface 109, according to some implementations. The first substrate may then be partially or fully removed to expose source ends of NAND memory strings 117. In some implementations, the removal of the first substrate includes a suitable etching process (e.g., dry etch and/or wet etch) and/or a planarization process (e.g., chemical mechanical polishing or CMP). The bonded chip, with the first substrate partially or fully removed, may be referred to as the semiconductor structure.

A doped amorphous silicon layer may be deposited over the semiconductor structure on the side/surface that the source ends of NAND memory strings 117 are exposed. The doped amorphous silicon layer may be in contact with at least the source ends of a plurality of, e.g., all, NAND memory strings 117 in the core array region. In some implementations, the doped amorphous silicon layer is deposited using a low-temperature deposition process, such as low-temperature chemical vapor deposition (CVD). For example, the deposition temperature may range from 400 degrees Celsius to 450 degrees Celsius. The dopants, e.g., phosphorus and/or arsenic, may be doped using an in-situ doping process. In some implementations, the thickness of the doped amorphous silicon layer ranges from 100 nm to 600 nm.

The doped amorphous silicon layer may be converted to a doped polysilicon layer. The doped amorphous silicon layer may cover any/all NAND memory strings 117 in the core array region. The conversion of doped amorphous silicon to doped polysilicon may include a local thermal treatment, such as a laser anneal process. The local thermal treatment may be confined in a desired controlled area, and would not affect other thermal-sensitive structures, such as the bonding contacts at bonding interface 109 and other metal structures/interconnects. The doped amorphous silicon layer may crystalize during the laser anneal and form a doped polysilicon layer. In some implementations, the temperature of the local thermal treatment may range from 1300 degrees Celsius to 1700 degrees Celsius. In some implementations, the laser anneal process includes a plurality of laser pulses in a laser beam, each having a pulse time of 100 ns (i.e., nanoseconds) to 300 ns. The doped polysilicon layer may be referred to as semiconductor layer 111, which extends at least in the core array region and in contact with NAND memory strings 117. Although not shown, the doped amorphous silicon layer may also have portions in the non-core array region. The portion(s) may or may not be converted to polysilicon. The specific layout of the amorphous silicon layer should not be limited by the implementations of the present disclosure.

One or more dielectric layers may be deposited and patterned over semiconductor layer 111, and one or more contact layers (if any), one or more contacts (if any), and one or more pad-out interconnects 119 may be formed in the dielectric layers to be conductively connected to semiconductor layer 111. The dielectric layers may include silicon oxide, silicon nitride, and/or silicon oxynitride. The dielectric layers can be formed by CVD, PVD, ALD, etc. The contact layers, contacts, and pad-out interconnects 119 may include tungsten and/or polysilicon, and can be formed by, but not limited to, CVD, PVD, ALD, electroplating, electroless plating, or any combination thereof. The patterning of dielectric layers may include any suitable patterning means such as photolithography and an etching (e.g., dry and/or wet etch) process.

Figure 2A:
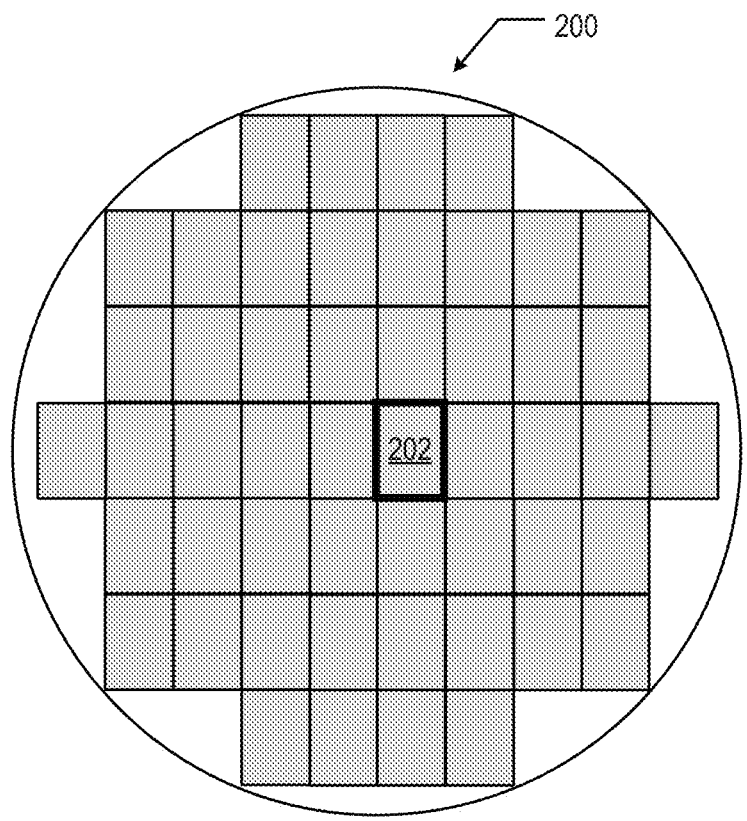
FIG. 2A illustrates a plan view of an exemplary wafer having a plurality of memory device chips, according to some aspects of the present disclosure.
Figure 2A:
Figure 2B:
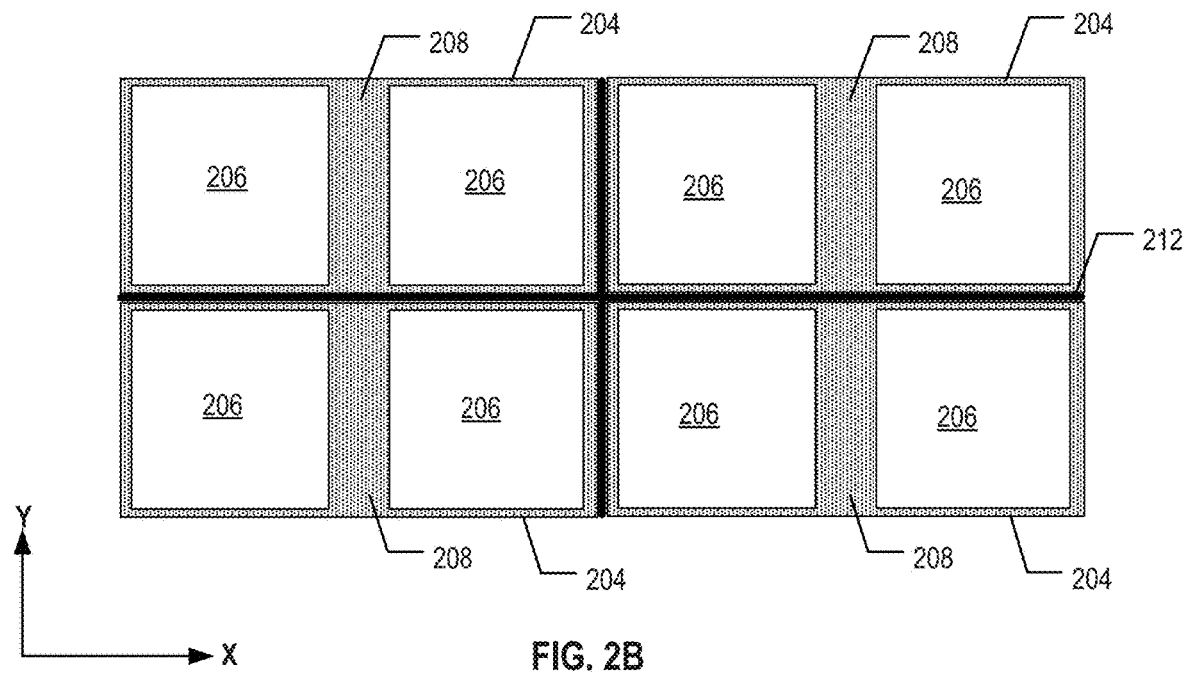
FIGS. 2B and 2C each illustrates a plan view of an exemplary shot in a memory device chip, according to some aspects of the present disclosure.
Figure 2C:
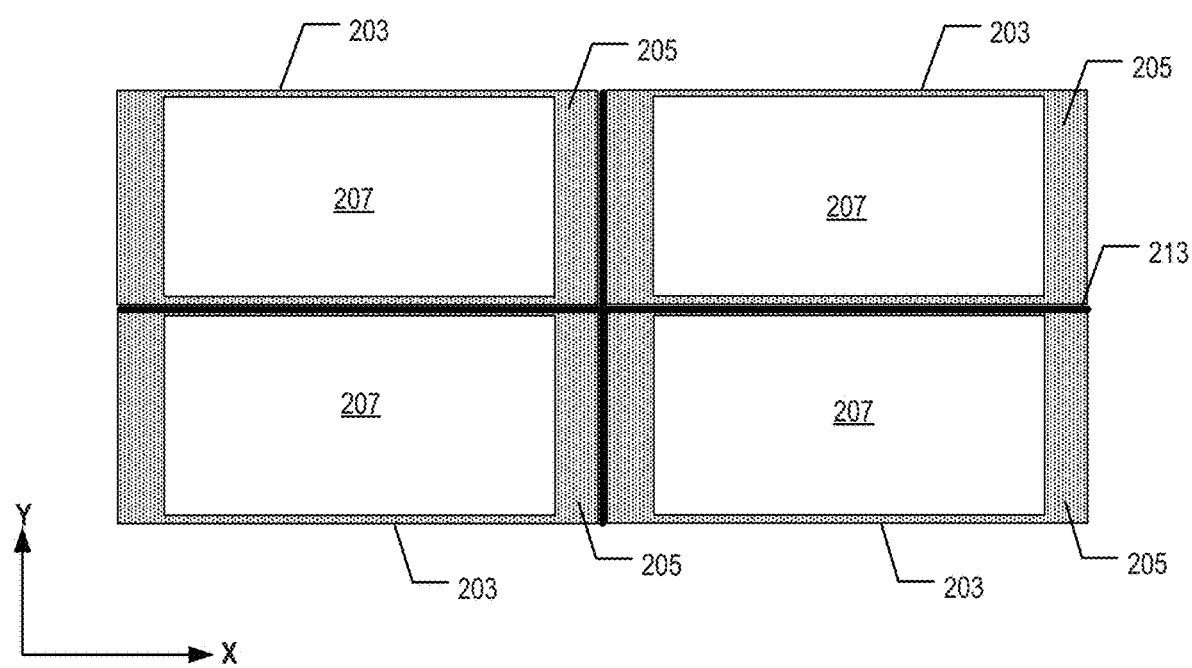
Figure 3A:
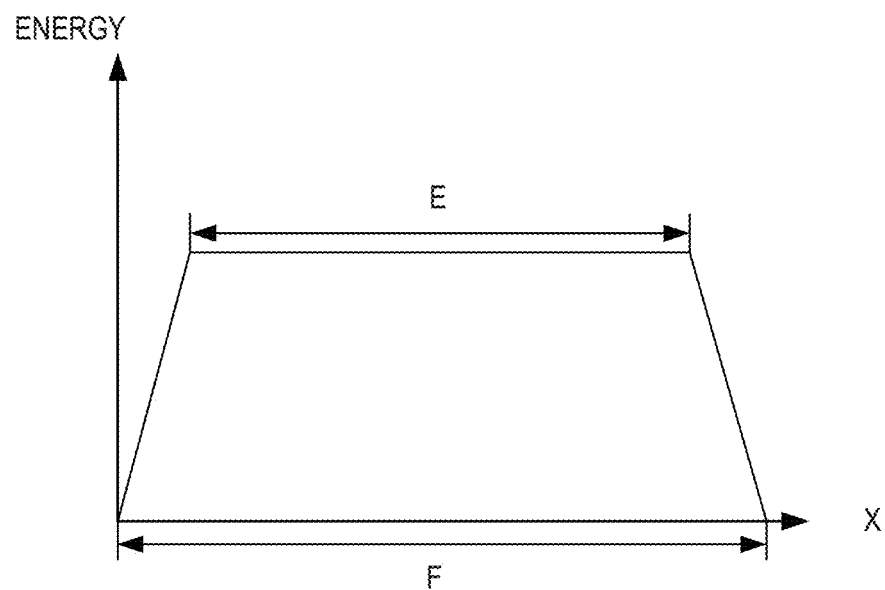
FIGS. 3A and 3B each illustrates an energy profile of a laser beam along a lateral direction, according to some aspects of the present disclosure.
Figure 3B:
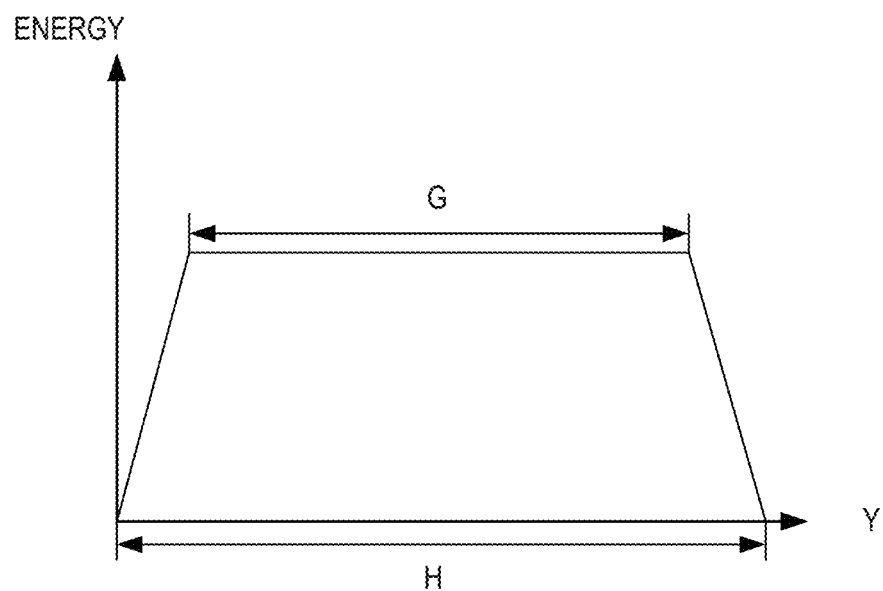

3D memory device 100 may be an example of one of a plurality of 3D memory devices in a wafer and undergoes a laser anneal to form a respective semiconductor layer. In some implementations, 3D memory device 100 may be in a 3D memory device chip. Depending on the size/area of the semiconductor layer 111, one or more laser beams can be controlled to treat the doped amorphous silicon in one core array region. Each laser beam may be incident on 3D memory device 100 in a focused laser spot. A treatment area, an area in which one or more laser beams are employed to anneal, can include one or more core array regions, according to implementations of the present disclosure. For example, if the focused laser spot of a single laser beam is greater than or equal to the treatment area, the single laser beam may be employed to anneal the treatment area. In another example, if the focused laser spot of a single laser beam is less than or equal to the treatment area, more than one laser beam may be employed to anneal the treatment area. The energy profile of a laser beam and/or the overlapping of more than one laser beam can be adjusted to facilitate uniform laser energy incidents on the treatment area. FIGS. 2A-2C illustrates exemplary layouts of core array regions and non-core array regions in a wafer, according to some implementations. FIGS. 3A and 3B each illustrates the energy profile of a laser beam along a respective lateral direction, according to some implementations. FIGS. 4A-4D, 5A-5C, 6A, and 6B illustrate different anneal scenarios in which the size/area of treatment area vary, according to some implementations.

FIG. 2A illustrates a plan view of an exemplary wafer 200 having a plurality of 3D memory device chips, according to some aspects of the present disclosure. FIGS. 2B and 2C each illustrates an example of a shot 202, according to some aspects of the present disclosure. Wafer 200 can include multiple shots 202 each including four dies, such as four 3D memory device chips, e.g., 3D memory device chips 204 in FIG. 2B or 3D memory device chips 203 in FIG. 2C. The four 3D memory device chips may be separated by scribe lines 212/213. As shown in FIGS. 2B and 2C, each 3D memory device chip 204/203 can include at least one stack structure. Each die (e.g., 3D memory device chip) may include one or more planes in the y-direction. The stack structure may include a memory stack having interleaved conductive layers (e.g., gate lines/word lines) and dielectric layers (e.g., gate-to-gate dielectrics), which is elevated from the surrounding down area. Each conductive/dielectric layer pair is at a different elevation and is referred to as one level. In some implementations, a stack structure includes a staircase structure on one or more sides of the stack structure. The staircase structure can have a sloped profile elevating from the surrounding down area outside the stack structure to the inner area within the stack structure. Based on the different elevations of the structures therein, 3D memory device chip 204/203 can be separated into a core array region (no fill) and a non-core array region (pattern fill).

As shown in FIG. 2B, in some implementations, 3D memory device chip 204 may include two stack structures having two core array regions 206 and a non-core array region 208 between and surrounding core array regions 206. The staircase region may be located in non-core array region 208 between core array regions 206. The staircase structure of the stack structures may be in the staircase region between the core array regions 206. Memory cell arrays can be formed in core array regions 206, for example, in the form of arrays of NAND memory strings each extending vertically through the respective stack structure.

Alternatively or additionally, as shown in FIG. 2C, in some implementations, 3D memory device chip 203 may include one stack structure having a core array region 207 and a non-core array region 205 on the sides of core array region 207. The staircase structure of the stack structure may be in the staircase region on the side(s) of the stack structure. Memory cell arrays can be formed in core array region 207, for example, in the form of arrays of NAND memory strings each extending vertically through the stack structure.

FIG. 3A illustrates an energy profile of a focused laser spot of a laser beam, used for laser anneal, in the x-direction, according to the present disclosure. FIG. 3B illustrates an energy profile of the focused laser spot in the y-direction, according to the present disclosure. Specifically, FIGS. 3A and 3B each illustrates the variation of energy from one end to another end of the focused laser spot in the x-direction and y-direction, respectively. As shown in FIGS. 3A and 3B, the energy of the focused laser spot may gradually increase from zero to a stable/constant positive value, and gradually decrease to zero. The ease of illustration, the area of the focused laser spot in which the energy is uniform and constant may be referred to as a central spot area, and the area of the focused laser spot in which the energy increases/decreases may be referred to as a peripheral spot area. In some implementations, the peripheral spot area surrounds the central spot area. As shown in FIG. 3A, along the x-direction, the energy of the focused laser spot may increase from zero to a positive value in the peripheral spot area, stay at the positive value in the central spot area, and decrease from positive value to zero in the peripheral spot area. Assuming the size/dimension of the focused laser spot in the x-direction is F, the central spot area may have a dimension E in the x-direction, and E is less than or equal to F. As shown in FIG. 3B, along the y-direction, the energy of the focused laser spot may increase from zero to the positive value in the peripheral spot area, stay at the positive value in the central spot area, and decrease from the positive value to zero in the peripheral spot area. Assuming the size/dimension of the focused laser spot in the y-direction is H, the central spot area may have a dimension G in the y-direction, and G is less than or equal to H.

In some implementations, the variation (e.g., increase and decrease) of energy versus distance in the peripheral spot area is linear, as depicted in FIGS. 3A and 3B. In various other implementations, the variation may be non-linear, such as parabolic, exponential, etc., depending on the settings of the laser beam. The correlation between energy versus distance and/or the size/area of the central spot area may vary in different implementations to meet the needs of fabrication processes. For example, the slope of the energy/distance line of one focused laser spot may be flatter or steeper in the peripheral spot area to decrease or increase the central spot area. In another example, the slopes of energy/distance lines of a plurality of focused laser spots may be adjusted respectively such that the accumulation of energy in the overlapped peripheral spot areas of the focused laser spots can form a minimum repeating spot that has sufficiently high energy for anneal. In some implementations, the energy profile of the focused laser spot is symmetric in the x-direction, and y-direction, respectively. In some implementations, the shape and dimensions of a focused laser spot can be changed, e.g., using optics to accommodate the shape of a treatment area that is to be annealed by the laser beam. Details may be provided as follows in view of FIGS. 4A-4D, 5A-5C, 6A, and 6B.

Figure 4A:
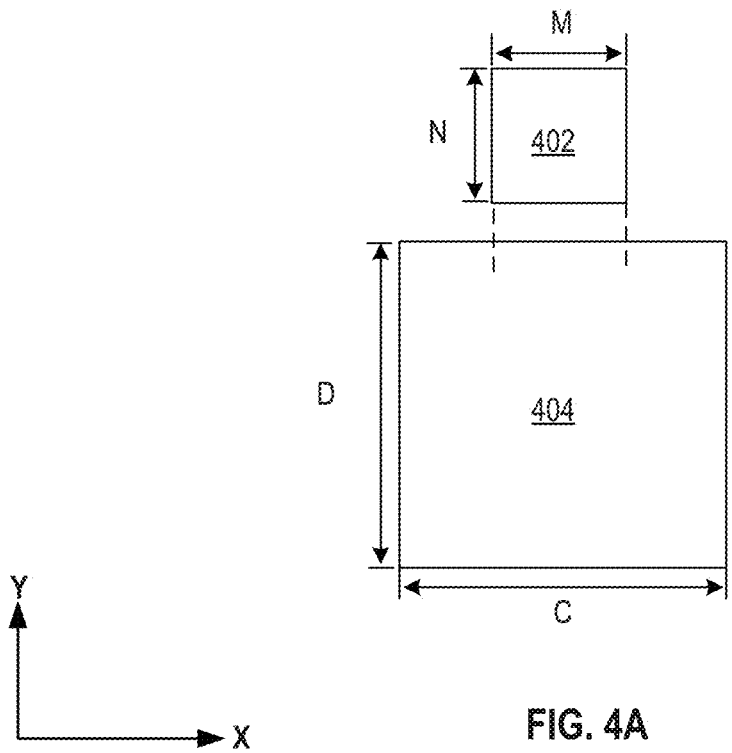
FIGS. 4A and 4B each illustrates a focused laser spot versus a treatment area, according to some aspects of the present disclosure.
Figure 4B:
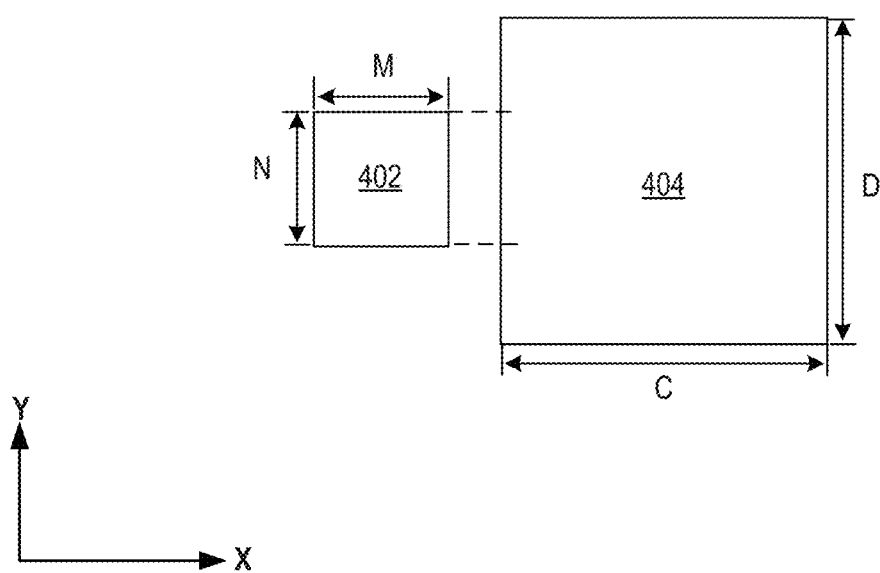
Figure 4C:
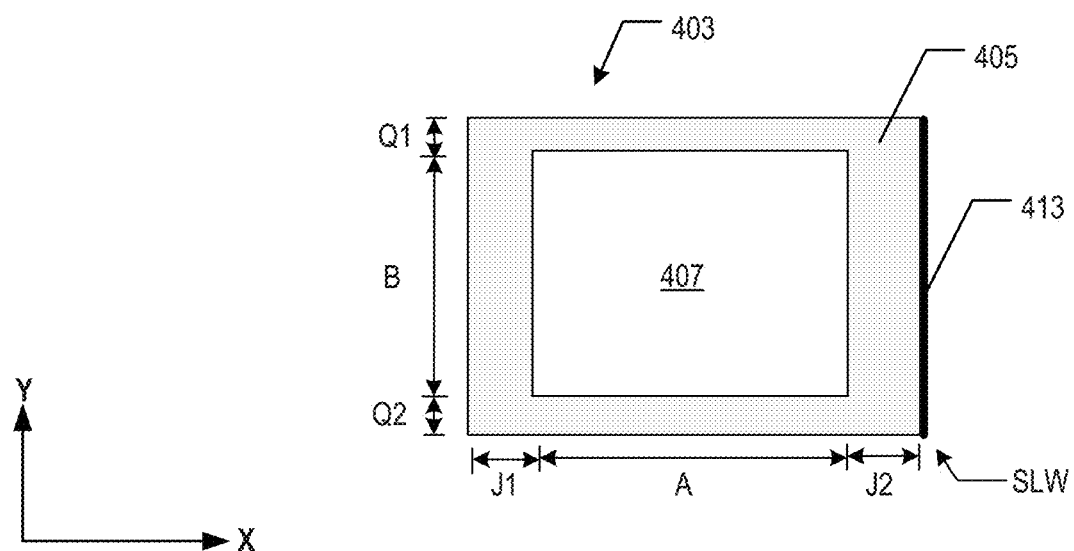
FIG. 4C illustrates dimensions of certain parts in an exemplary 3D memory device, according to some aspects of the present disclosure.
Figure 4D:
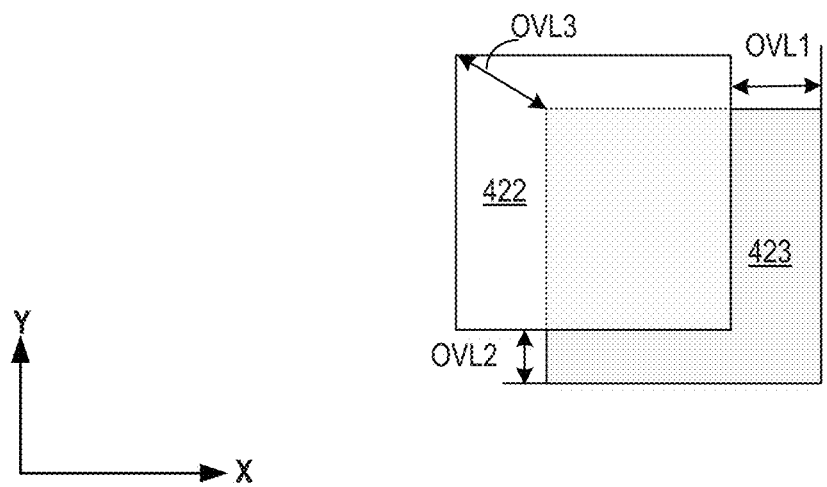
FIG. 4D illustrates overlay error between a focused laser spot and a treatment area, according to some aspects of the present disclosure.

FIGS. 4A and 4B illustrate a scenario in which the size/area of a focused laser spot is greater than or equal to the size/area of a treatment area in a wafer, according to some implementations of the present disclosure. In FIGS. 4A and 4B, a single focused laser spot is employed to anneal one or more core array regions in a treatment area 402 in a wafer. Treatment area 402 may have a lateral dimension of M in the x-direction and a lateral dimension of N in the y-direction. FIG. 4C illustrates dimensions of certain parts in an exemplary 3D memory device, according to some aspects of the present disclosure. FIG. 4D illustrates overlay error between a focused laser spot and a treatment area, according to some aspects of the present disclosure.

As shown in FIG. 4C, 3D memory device 403 may include a core array region 407, a non-core array region 405, and a scribe line 413. Core array region 407, non-core array region 405, and scribe line 413 may respectively represent core array region 206/207, non-core array region 208/205, and scribe line 212/213. Core array region 407 may have a dimension of A in the x-direction and a dimension of B in the y-direction. A dimension of non-core array region 405 in the x-direction may be J which is equal to (J1+J2), J1, and J2, respectively being the dimensions of non-core array region 405 on each side of core array region 407 in the x-direction. A dimension of non-core array region 405 in the y-direction may be Q which is equal to (Q1+Q2), Q1 and Q2 respectively being the dimensions of non-core array region 405 on each side of core array region 407 in the y-direction. Depending on the layout of 3D memory device 403 (e.g., referring to 3D memory device chips 204 and 203), the values of J1, J2, Q1, and Q2 may vary. In some implementations, the dimensions of non-core array region 405 in the x- and y-directions may respectively be the same as those of the staircase region in the x- and y-directions. SLW may represent the width of scribe line 413 in a direction perpendicular to the direction in which scribe line 413 extends. In the example shown in FIG. 4C, scribe line 413 extends in the y-direction, and SLW represents the width of scribe line 413 in the x-direction. Core array region 407 and non-core array region 405 may each be depicted to have a rectangular shape. In various implementations, core array region 407 and non-core array region 405 can have the same shape or different shapes, and each can have any other suitable shapes such as circular, irregular, etc.

FIG. 4D shows overlay error that can occur between a focused laser spot and a treatment area. The overlay error may be represented by the misalignment between an actual focused laser spot 422 and a targeted focused laser spot 423. In some implementations, actual focused laser spot 422 refers to the actual pattern formed by the laser beam on the treatment area, targeted focused laser spot 423 refers to the targeted pattern intended to be formed by the laser beam, and the overlay error refers to any differences between the actual pattern and the targeted pattern in the x-y plane. For example, the overlay error may include a lateral overlay error OVL1 in the x-direction, a lateral overlay error OVL2 in the y-direction, and/or a diagonal overlay error OVL3 in a lateral direction different from the x- and y-directions. Overlay error OVL1, OVL2, and OVL3 may represent the overlay error between actual focused laser spot 422 and the treatment area in the present disclosure. In the present disclosure, overlay error between a focused laser spot and a treatment area may be represented by OVL, which can be determined based on one or more of OVL1, OVL2, and OVL3.

Referring back to FIGS. 4A and 4B, in some implementations, a treatment area 402 may include a single core array region (e.g., 407). The core array region may have a dimension of A in the x-direction and a dimension of B in the y-direction, as illustrated in FIG. 4C. That is, in this example, M is equal to A, and N is equal to B. In some implementations, the treatment area includes a single core array region and does not include a staircase region. In some implementations, doped amorphous silicon is also formed in the staircase region but not annealed. Laser-illuminated region 404 may represent a single focused laser spot that has a dimension of C in the x-direction and a dimension of D in the y-direction. That is, C is equal to F, and D is equal to H. For ease of illustration, treatment area 402 and laser-illuminated region 404 may each be depicted to have a rectangular, e.g., square, shape. In various implementations, treatment area 402 and laser-illuminated region 404 can each have any other suitable shapes such as circular, irregular, etc. Laser-illuminated region 404 is sufficiently large to fully encompass/cover treatment area 402, e.g., in the z-direction (not shown), in a laser anneal. In some implementations, C is greater than or equal to M (or A), and D is greater than or equal to N (or B). In some implementations, E is greater than or equal to A, and G is greater than or equal to B. The energy profile of the focused laser spot that forms laser-illuminated region 404 may be controlled to illuminate light of uniform and constant energy on treatment area 402. For example, the lateral dimensions of the single focused laser spot can be adjusted. Optionally or alternatively, the slopes of the energy profile of the single focused laser spot can also be adjusted. In some implementations, F may be controlled to be greater than or equal to $(A+(F-E)+OVL)$ and less than or equal to $(A+(F-E)+SLW)$, i.e., $(A-E+OVL) \leq 0 \leq (A-E+SLW)$. OVL may represent an overlay error between the focused laser spot and treatment area 402, and SLW may represent a width of a scribe line (e.g., 413). In some implementations, H may be controlled to be greater than or equal to $(B+(H-G)+OVL)$ and less than or equal to $(B+(H-G)+SLW)$, i.e., $(B-G+OVL) \leq 0 \leq (B-G+SLW)$.

In some implementations, treatment area 402 may include more than one core array regions (e.g., 407). In some implementations, the treatment area includes a plurality of core array regions and at least one staircase region, of which the dimensions/area can be represented by the dimensions/area of non-core array region, referring to the description of FIG. 4C. Laser-illuminated region 404 may represent a single focused laser spot, with C being equal to F and D being equal to H. For ease of illustration, treatment area 402 and laser-illuminated region 404 may each be depicted to have a rectangular, e.g., square, shape. In various implementations, treatment area 402 and laser-illuminated region 404 can each have any other suitable shapes such as circular, irregular, etc. Laser-illuminated region is sufficiently large to fully encompass/cover treatment area 402, e.g., in the z-direction (not shown), in a laser anneal. In some implementations, C is greater than or equal to M, and D is greater than or equal to N. In some implementations, E is greater than or equal to M, and G is greater than or equal to N.

The energy profile of the focused laser spot that forms laser-illuminated region 404 may be controlled to illuminate light of uniform and constant energy on treatment area 402, which can include one or more core regions and optionally one or more staircase regions. That is, in this example, M is equal to or greater than A, and N is equal to or greater than B. For example, the lateral dimensions of the single focused laser spot can be adjusted. Optionally or alternatively, the slopes of the energy profile of the single focused laser spot can also be adjusted. In some implementations, F may be controlled to be greater than or equal to $(mA+jP+(F-E)+OVL)$ and less than or equal to $(mA+jP+(F-E)+SLW)$, i.e., $(mA+jP-E+OVL) \leq 0 \leq (mA+jP-E+SLW)$. OVL may represent an overlay error between the focused laser spot and treatment area 402, and SLW may represent a width of a scribe line (e.g., 413). In some implementations, H may be controlled to be greater than or equal to $(nB+kQ+(H-G)+OVL)$ and less than or equal to $(nB+kQ+(H-G)+SLW)$, i.e., $(nB+kQ-G+OVL) \leq 0 \leq (nB+kQ-G+SLW)$. P and Q may respectively represent the dimension of one staircase region (e.g., non-core array region) in the x-direction and y-direction. In some implementations, m and n may respectively represent the number of core array regions in the x-direction and y-direction in the treatment area, m and n each being equal to or greater than 1. In some implementations, at least one of m and n is greater than or equal to 2. For example, m may be equal to or greater than 2. In some implementations, j and k may respectively represent the number of staircase regions in the x-direction and y-direction in the treatment area, j and k may each be a non-negative integer.

In some implementations, treatment area 402 includes all core array regions and staircase regions (e.g., non-core array regions) in a die of the wafer. In some implementations, treatment area 402 includes all core array regions and staircase regions (e.g., non-core array regions) in a plane of the wafer. In some implementations, treatment area 402 includes all planes of the wafer. In some implementations, treatment area 402 includes all dies in a shot of the wafer. In various implementations, based on treatment area 402, the values of m, n, j, and k may be adjusted accordingly to ensure the size/area of laser-illuminated region 404 is sufficiently large to cover treatment area 402 and illuminate treatment area 402 with constant/uniform energy.

Figure 5A:
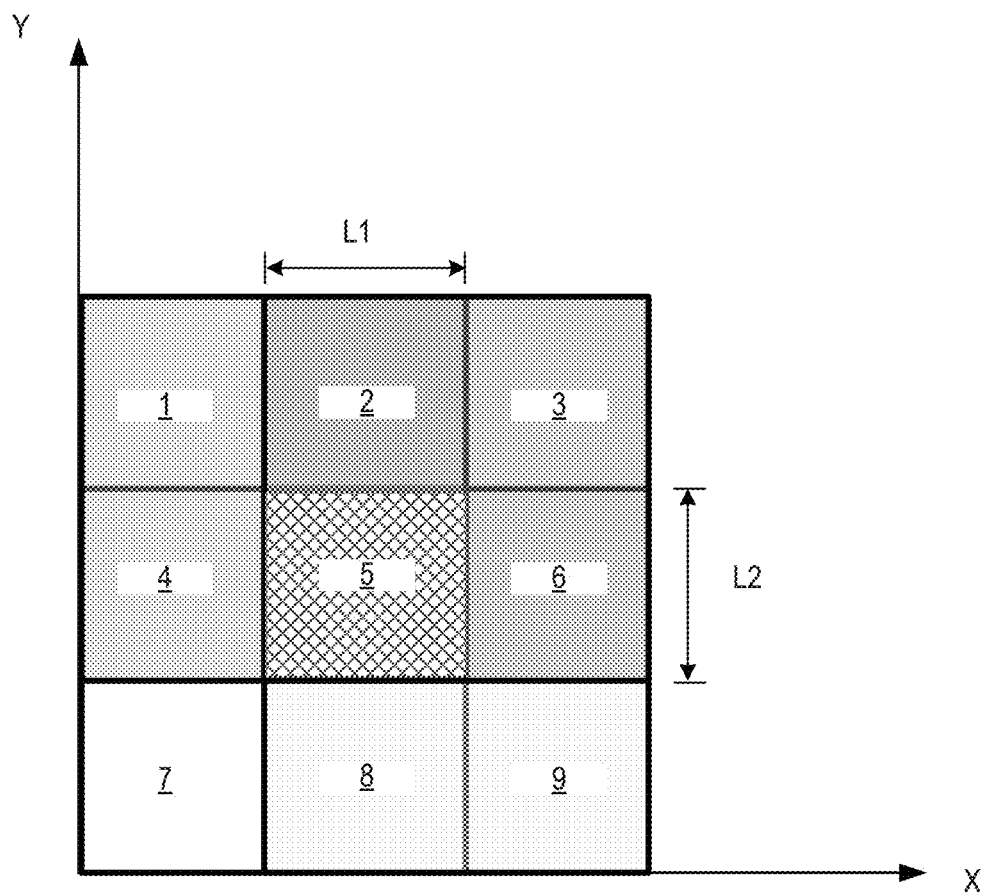
FIG. 5A illustrates a minimum repeating spot formed by a plurality of focused laser spots, according to some aspects of the present disclosure.
Figure 5B:
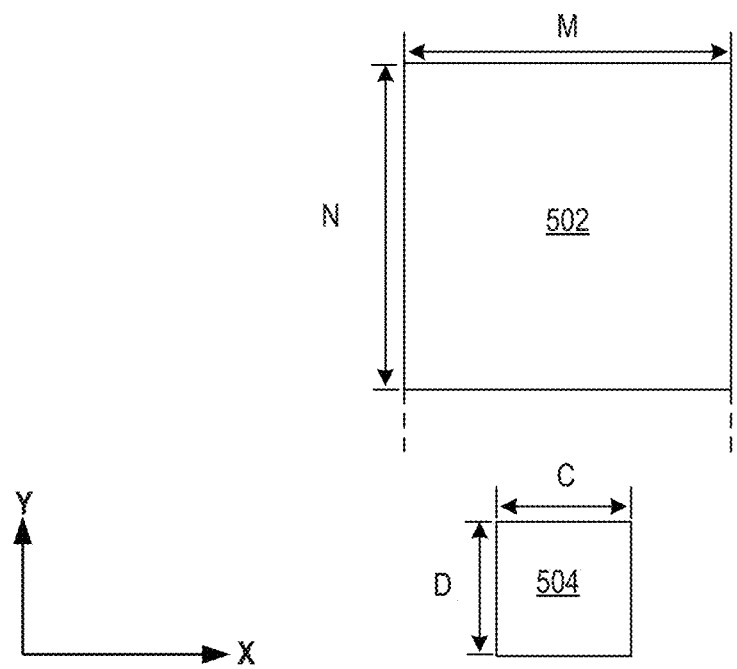
FIGS. 5B, 5C, 6A, and 6B each illustrates a focused laser spot versus a treatment area, according to some aspects of the present disclosure.
Figure 5C:
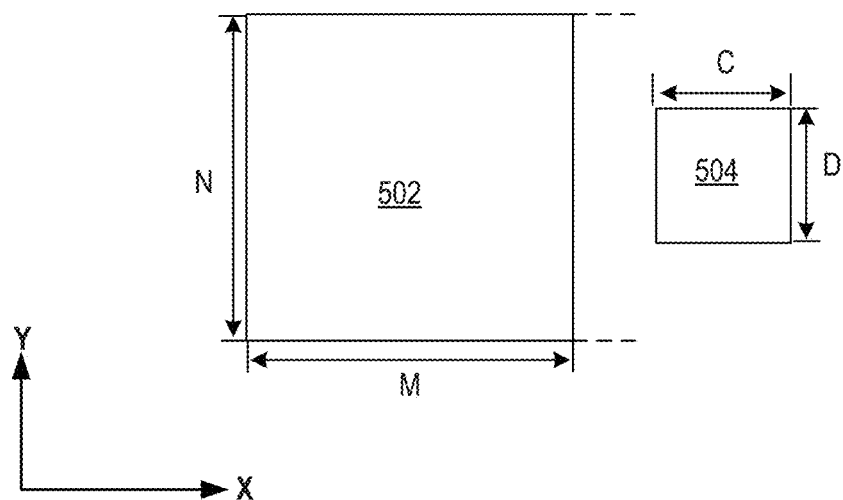

FIGS. 5A-5C illustrates a scenario in which the size/area of a focused laser spot is less than or equal to the size/area of a treatment area in a wafer, according to some implementations of the present disclosure. FIG. 5A illustrates a minimum repeating spot formed by the overlapping of a plurality of focused laser spots, according to some implementations of the present disclosure. Pattern 500, a laser-illuminated region, may be formed by the overlapping of multiple, e.g., four, focused laser spots, on a treatment area. For ease of illustration, pattern 500 may be depicted as illuminating on a plurality of, e.g., 9, regions. As shown in FIG. 5A, a first focused laser spot may be illuminated on regions 1, 2, 4, and 5; a second focused laser spot may be illuminated on regions 2, 3, 5, and 6; a third focused laser spot may be illuminated on regions 4, 5, 7, and 8; and a fourth focused laser spot may be illuminated on regions 5, 6, 8, and 9. The energy profile of each of the first, second, third, and fourth focused laser spots may be the same or different. For example, the slopes and dimensions of focused laser spots may be the same or different. In various implementations, the energy profile of each of the focused laser spots can be adjusted respectively to obtain the minimum repeating spot of desired dimensions and/or energy. For ease of illustration, in the present disclosure, the plurality of focused laser spots have the same energy profiles.

Region 5 may be the mutual overlapping area of all four focused laser spots and may thus be illuminated by all four focused laser spots. Region 5 is thus annealed with the energy of all four focused laser spots. In the present disclosure, the overlapped portion of four focused laser spots in region 5 is referred to as a minimum repeating spot and is employed to anneal an entire treatment area. In some implementations, the energy of the minimum repeating spot is formed by the overlapping of the energy of the four focused laser spots in the peripheral spot areas. As shown in FIG. 5A, the minimum repeating spot may have a lateral dimension of L1 in the x-direction and a lateral dimension of L2 in they-direction. L1 may be equal to (F–E)/2, and L2 may be equal to (H–G)/2. In some implementations, L1 is less than or equal to the lateral dimension of the treatment area in the x-direction, and L2 is less than or equal to the lateral dimension of the treatment area in the y-direction. In some implementations, the multiple, e.g., four, focused laser spots may be controlled to move in the treatment area such that uniform and constant energy of the minimum repeating spot is applied on the treatment area.

As shown in FIGS. 5B and 5C, a plurality of focused laser spots are employed to anneal one or more core array regions in a treatment area 402 in a wafer. Treatment area 502 may have a lateral dimension of M in the x-direction and a lateral dimension of N in the y-direction.

In some implementations, a plurality of focused laser spots are employed to anneal a single core array region in a wafer. The core array region may have a dimension of A in the x-direction and a dimension of B in the y-direction, as illustrated in FIG. 4C. In this example, M is equal to A, and N is equal to B. In some implementations, treatment area 502 includes a single core array region and does not include a staircase region. In some implementations, doped amorphous silicon is also formed in the staircase region but not annealed. Laser-illuminated region 504 may represent an area illuminated by the plurality of focused laser spots and has a dimension of C in the x-direction and a dimension of D in the y-direction, such as pattern 500. For ease of illustration, treatment area 502 and laser-illuminated region 504 may each be depicted to have a rectangular, e.g., square, shape. In various implementations, treatment area 502 and laser-illuminated region 504 can each have any other suitable shapes such as circular, irregular, etc. Laser-illuminated region 504 is smaller than treatment area 502. In some implementations, C is less than or equal to M (or A), and D is less than or equal to N (or B). The plurality of focused laser spots, forming laser-illuminated region 504, may be controlled to form a minimum repeating spot (e.g., as illustrated in FIG. 5A) and move in treatment area 502 to apply the minimum repeating spot on the entire treatment area 502. In some implementations, the minimum repeating spot may be located at a central part of laser-illuminated region 504, and the energy applied in treatment area 502 is uniform and constant. For example, the focused laser spots may be moved in the x- and y-directions consecutively to ensure the same energy is applied across treatment area 502. The energy profile of each focused laser spot may also be respectively adjusted to form the minimum repeating spot of desired dimensions. For example, the lateral dimensions of the single focused laser spot can be adjusted. Optionally or alternatively, the slopes of the energy profile of the single focused laser spot can also be adjusted. In some implementations, C may be controlled to be greater than or equal to (mE+OVL) and less than or equal to (mE+SLW), i.e., (mE+OVL)≤C≤(mE+SLW). OVL may represent an overlay error between the focused laser spot and treatment area 502, and SLW may represent the width of a scribe line (e.g., 413). In some implementations, D may be controlled to be greater than or equal to (nG+OVL) and less than or equal to (nG+SLW), i.e., (nG+OVL)≤D≤(nG+SLW). In some implementations, m and n may respectively represent the number of core array regions in the x-direction and y-direction in the treatment area, and m and n may each be an integer. For example, m and n may each be a positive integer.

In some implementations, treatment area 502 may include more than one core array region (e.g., 407). In some implementations, the treatment area includes a plurality of core array regions and at least one staircase region, of which the dimensions/area can be represented by the dimensions/area of non-core array region, referring to the description of FIG. 4C. In this example, M is greater than or equal to A, and N is greater than or equal to B. In some implementations, C is less than or equal to M, and D is less than or equal to N. The plurality of focused laser spots, forming laser-illuminated region 504, may be controlled to form a minimum repeating spot (e.g., as illustrated in FIG. 5A) and move in treatment area 502 to apply the minimum repeating spot on the entire treatment area 502. In some implementations, the minimum repeating spot may be located at a central part of laser-illuminated region 504, and the energy applied in treatment area 502 is uniform and constant. For example, the focused laser spots may be moved in the x- and y-directions consecutively to ensure the same energy is applied in treatment area 502. The energy profile of each focused laser spot may also be respectively adjusted to form the minimum repeating spot of desired dimensions. For example, the lateral dimensions of the single focused laser spot can be adjusted. Optionally or alternatively, the slopes of the energy profile of the single focused laser spot can also be adjusted. In some implementations, C may be controlled to be greater than or equal to (mE+jP+OVL) and less than or equal to (mE+jP+SLW), i.e., (mE+jP+OVL)≤C≤(mE+jP+SLW). OVL may represent an overlay error between the focused laser spot and treatment area 502, and SLW may represent the width of a scribe line (e.g., 413). In some implementations, D may be controlled to be greater than or equal to (nG+kQ+OVL) and less than or equal to (nG+kQ+SLW), i.e., (nG+kQ+OVL)≤D≤(nG+kQ+SLW). In some implementations, m and n may respectively represent the number of core array regions in the x-direction and y-direction in the treatment area, and m and n may each be an integer. For example, m and n may each be a positive integer. P and Q may respectively represent the dimension of one staircase region (e.g., non-core array region) in the x-direction and y-direction. In some implementations, m and n may respectively represent the number of core array regions in the x-direction and y-direction in the treatment area, m and n each being equal to or greater than 1. In some implementations, at least one of m and n is greater than or equal to 2. For example, m may be equal to or greater than 2. In some implementations, j and k may respectively represent the number of staircase regions in the x-direction and y-direction in the treatment area, j and k may each be a non-negative integer.

In some implementations, treatment area 502 includes all core array regions and staircase regions (e.g., non-core array regions) in a die of the wafer. In some implementations, treatment area 502 includes all core array regions and staircase regions (e.g., non-core array regions) in a plane of the wafer. In some implementations, treatment area 502 includes all planes of the wafer. In some implementations, treatment area 502 includes all dies in a shot of the wafer. In various implementations, based on treatment area 502, the values of m, n, j, and k may be adjusted accordingly to ensure the size/area of laser-illuminated region 504 is sufficiently large to cover treatment area 502 and illuminate treatment area 502 with constant/uniform energy.

Figure 6A:
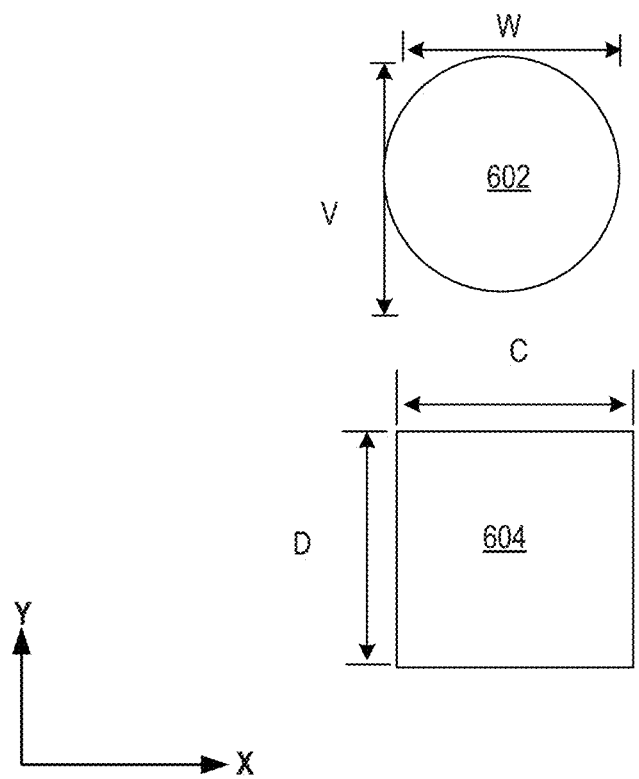
Figure 6B:
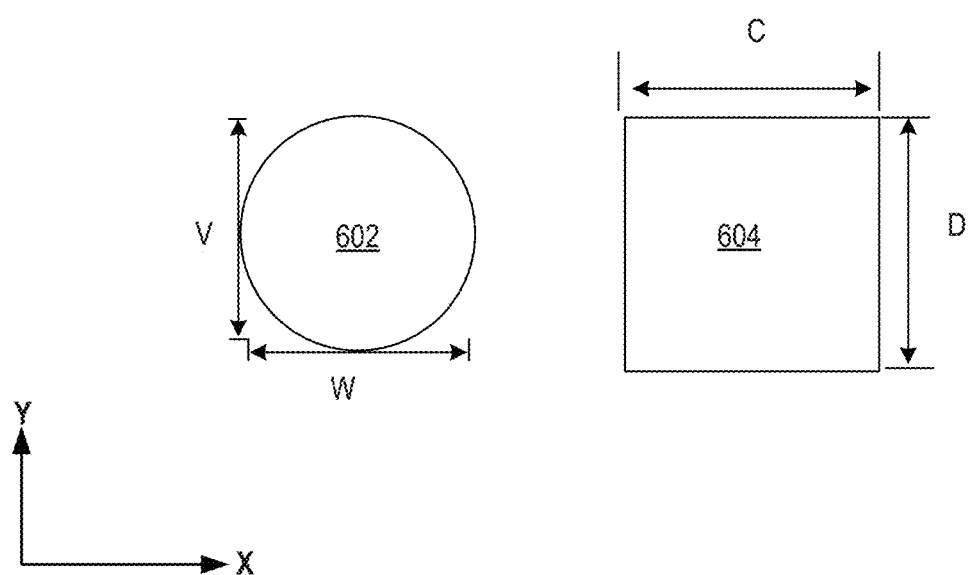

FIGS. 6B and 6C illustrate a scenario in which the size/area of a focused laser spot is greater than or equal to the size/area of a wafer, according to some implementations of the present disclosure. In FIGS. 6B and 6B, a single laser spot is employed to anneal the plurality of core array regions and staircase regions in a treatment area, e.g., a wafer 602. Wafer 602 may have a lateral dimension of W in the x-direction and a lateral dimension of V in the y-direction.

In some implementations, a laser-illuminated region 604 may represent an area illuminated by a single focused laser spot and has a dimension of C in the x-direction and a dimension of D in the y-direction. For ease of illustration, wafer 602 and laser-illuminated region 604 may respectively be depicted to have a circular shape and a rectangular, e.g., square, shape. In various implementations, wafer 602 and laser-illuminated region 604 can each have any other suitable shapes such as irregular shape, etc. Laser-illuminated region 504 may be greater than or equal to treatment area 502. For a single focused laser spot, C is equal to F, and D is equal to H. In some implementations, F is greater than or equal to W, and H is greater than or equal to V. In some implementations, E is greater than or equal to W, and G is greater than or equal to V. The energy profile of the focused laser spots may also be respectively adjusted to apply uniform and constant energy on wafer 602. For example, the lateral dimensions of the single focused laser spot can be adjusted. Optionally or alternatively, the slopes of the energy profile of the single focused laser spot can also be adjusted. In some implementations, F may be controlled to be greater than or equal to (W+OVL), i.e., F≥(W+OVL). OVL may represent an overlay error between the focused laser spot and treatment area 502. In some implementations, H may be controlled to be greater than or equal to (V+OVL), i.e., H≥(V+OVL).

Figure 7:
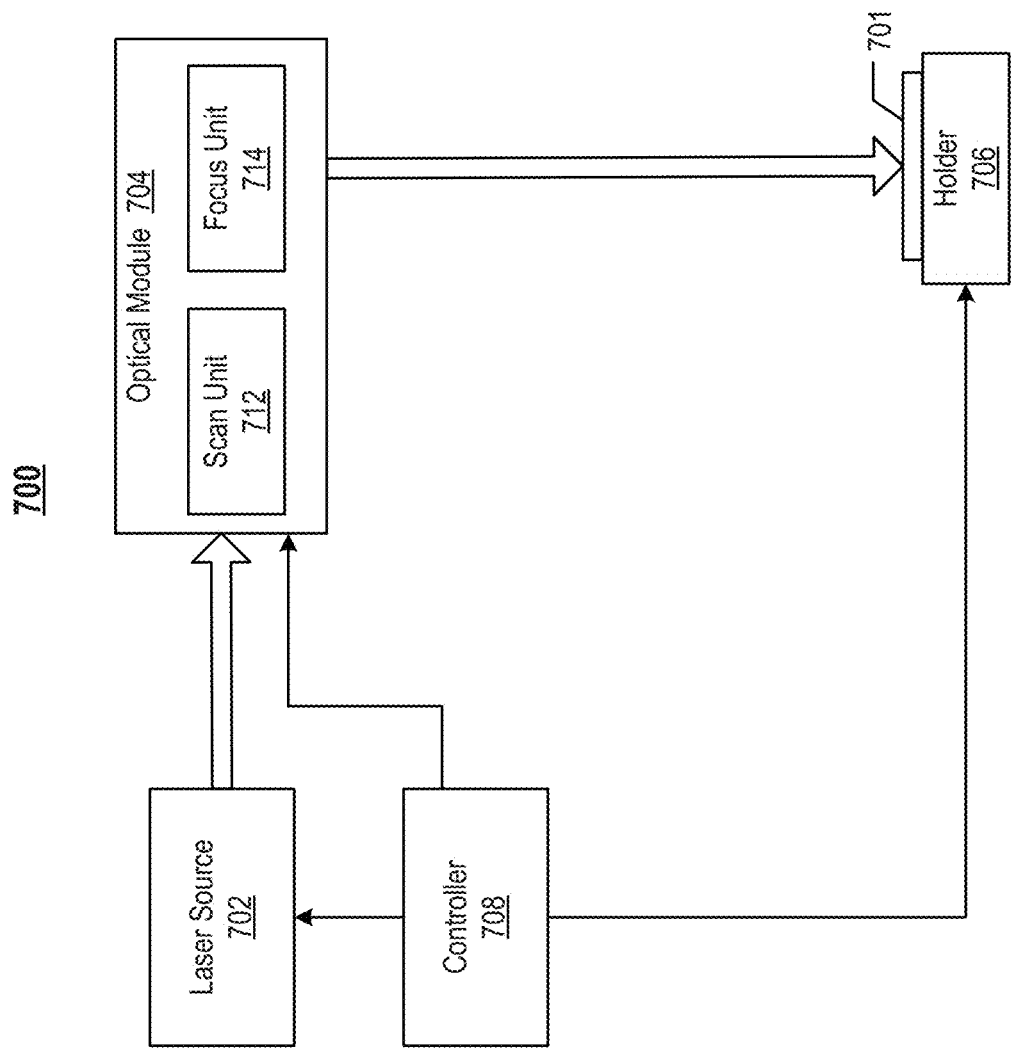
FIG. 7 illustrates a schematic diagram of an apparatus for performing a laser anneal on a semiconductor device, according to some aspects of the present disclosure.

FIG. 7 illustrates a schematic diagram of an exemplary system 700 for laser anneal in a 3D memory device using focused laser spots, according to some implementations of the present disclosure. System 700 can include a laser source 702, an optical module 704, a holder 706, and a controller 708. Laser source 702 can be any suitable type of laser source including, but not limited to, fiber lasers, solid-state lasers, gas lasers, and semiconductor lasers. Laser source 702 can be configured to generate one or more laser beams at any suitable wavelengths, such as 532 nm laser, 600-1,000 nm lasers, 1,064 nm laser, 1,550 nm laser, etc. The laser beams generated by laser source 702 may form a focused laser spot on a treatment area for a laser anneal process. The focused laser spot may have an energy profiled as shown in FIGS. 3A and 3B.

Optical module 704 can be optically coupled to laser source 702 and include a scan unit 712 and a focus unit 714. Optical module 704 can be configured to provide one or more focused laser spots on a treatment area 701 based on the one or more laser beams generated by laser source 702. In some implementations, optical module 704 is operatively coupled to controller 708 and receives control signals and instructions from controller 708. Scan unit 712 can be configured to, based on the control of controller 708, change directions in which at least some of the laser beams emit to treatment area 701 on holder 706. For example, controlled by controller 708, optical module 704 may move one or more focused laser spots on treatment area 701 in various directions, e.g., the x- and y-directions such that uniform and constant energy can cover treatment area 701. That is, scan unit 712 can scan the laser beams within a scan angle at a scan rate, as controlled by controller 708, towards treatment area 701. In some implementations, scan unit 712 includes a galvanometer and/or a polarizer. Scan unit 712 can further include any other suitable scanning mirrors and scanning refractive optics.

Focus unit 714 can be configured to focus each of the laser beams to form a respective focused laser spot. In some implementations, a dimension of each of the focused laser spots (e.g., the values of F and H) is between 1 micrometer (μm) and 500 μm, such as 1 μm, 2 μm, 3 μm, 4 μm, 5 μm, 6 μm, 7 μm, 8 μm, 9 μm, 10 μm, 20 μm, 30 μm, 40 μm, 50 μm, 60 μm, 70 μm, 80 μm, 90 μm, 100 μm, 200 μm, 300 μm, 400 μm, 500 μm, any range bounded by the lower end by any of these values, or in any range defined by any two of these values. The shape of each focused laser spot can include, for example, round, rectangle, square, irregular, or any suitable shapes. It is understood that the dimensions of a series of focused laser spots can be substantially the same or different. By focusing the laser beams into focused laser spots, the energy density can be significantly increased.

Holder 706 can be configured to hold treatment area 701. In some implementations, holder 706 includes a wafer holder for semiconductor fabrication. In some implementations, holder 706 is further configured to, based on the control of controller 708, change positions and/or orientations of treatment area 701 during the anneal.

Controller 708 can be operatively coupled to laser source 702, optical module 704, and/or holder 706 and control the operations of laser source 702, optical module 704, and/or holder 706 via control signals and instructions. In some implementations, controller 708 is configured to control optical module 704 and/or holder 706 to move the focused laser spots on treatment area 701 to form a scan pattern. As optical module 704 scans the focused pulsed lasers toward treatment area 701, any relative movement between holder 706 holding treatment area 701 and optical module 704 can cause movement of the focused laser spots on treatment area 701, thereby forming a scan pattern based on the relative movement. By controlling the relative movements between holder 706 and optical module 704, such as the direction and speed, controller 708 can control the scan pattern, e.g., the size and/or shape thereof, on the treatment area. For example, controller 708 may control the optical module 704 to focus and overlap a plurality of laser beams on treatment area 701 and form a minimum repeating spot on treatment area 701. Moreover, controller 708 can further control the scan pattern by adjusting the parameters of the laser beams generated by laser source 702 by controlling the operation of laser source 702. In some implementations, the scan pattern is manually determined by a human operator, such as a technician, based on the design of the 3D memory device. In some implementations, the scan pattern is automatically or semi-automatically determined based on treatment area 701 by controller 708.

In some implementations, system 700 further includes a calibration unit (not shown) configured to calibrate positions of the focused laser spots on treatment area 701. Controller 708 can be configured to control optical module 704 and/or holder 706 to move the focused laser spots on treatment area 701 based on the calibration performed by the calibration unit.

Figure 8:
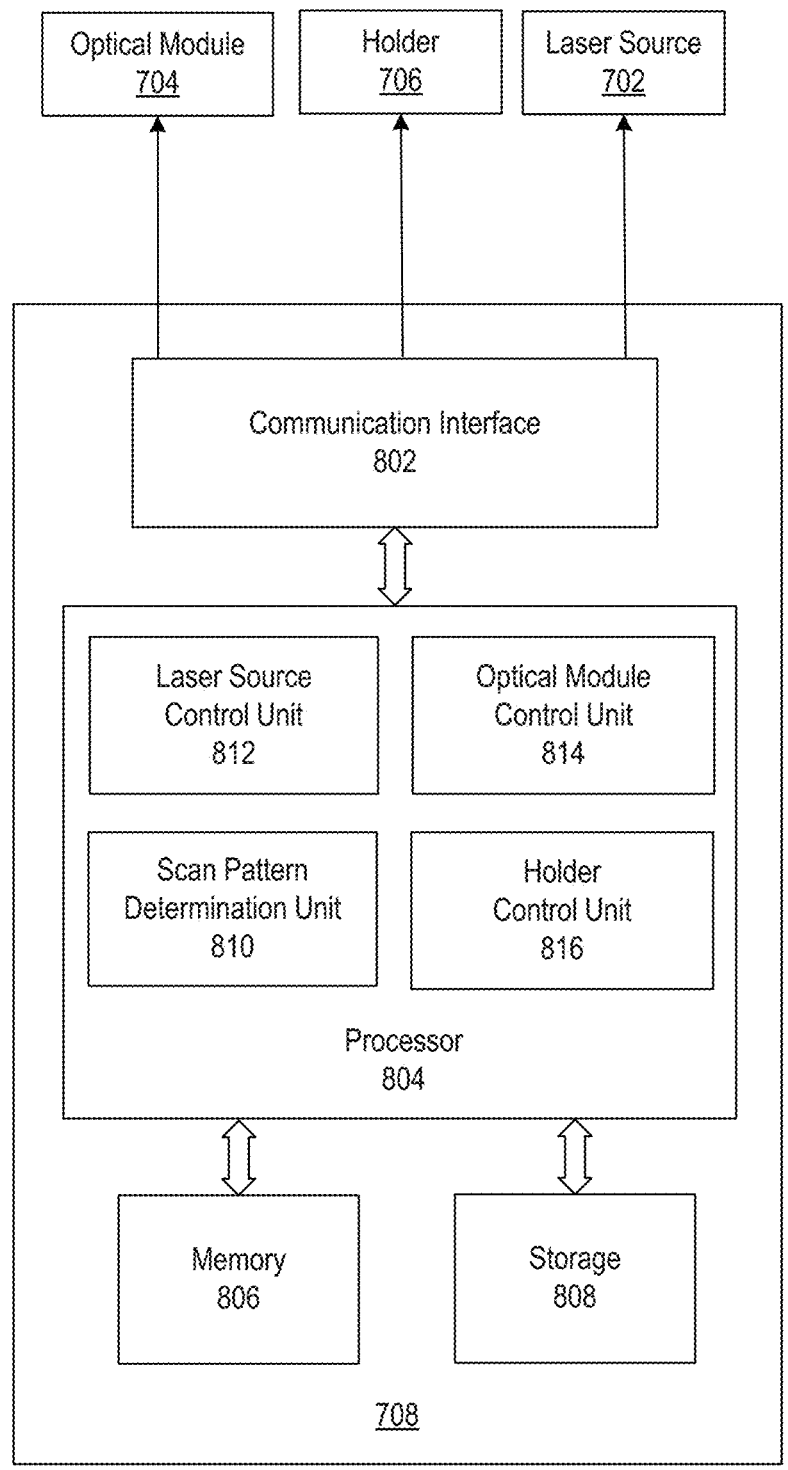
FIG. 8 illustrates a schematic diagram of a controller for controlling a laser anneal, according to some aspects of the present disclosure.

FIG. 8 illustrates a schematic diagram of exemplary controller 708, according to some implementations of the present disclosure. Controller 708 can control operations of laser source 702, optical module 704, and/or holder 706, for example, generate, adjust, and move focused laser spots on treatment area 701 to form a scan pattern on treatment area 701. In some implementations, controller 708 receives data indicative of treatment area 701 and provides control instruction indicative of the scan pattern to laser source 702, optical module 704, and/or holder 706.

As shown in FIG. 8, controller 708 can include a communication interface 802, a processor 804, a memory 806, and a storage 808. In some implementations, controller 708 has different modules in a single device, such as an integrated circuit (IC) chip (implemented as an application-specific integrated circuit (ASIC) or a field-programmable gate array (FPGA), or separate devices with dedicated functions. One or more components of controller 708 can be located along with laser source 702 and/or optical module 704 as part of system 700, or can be alternatively in a standalone computing device, in the cloud, or another remote location. Components of controller 708 can be in an integrated device or distributed at different locations but communicate with each other through a network (not shown). For example, processor 804 can be a processor on-board laser source 702 and/or optical module 704, a processor inside a standalone computing device, or a cloud processor, or any combinations thereof.

Communication interface 802 may send data to and receive data from components such as laser source 702, optical module 704, or holder 706 via communication cables, a Wireless Local Area Network (WLAN), a Wide Area Network (WAN), wireless networks such as radio waves, a nationwide cellular network, and/or a local wireless network (e.g., Bluetooth® or WiFi), or other communication methods. In some implementations, communication interface 802 can be an integrated services digital network (ISDN) card, cable modem, satellite modem, or a modem to provide a data communication connection. As another example, communication interface 802 can be a local area network (LAN) card to provide a data communication connection to a compatible LAN. Wireless links can also be implemented by communication interface 802. In such an implementation, communication interface 802 can send and receive electrical, electromagnetic or optical signals that carry digital data streams representing various types of information via a network.

Processor 804 can include any appropriate type of general-purpose or special-purpose microprocessor, digital signal processor, or microcontroller. Processor 804 can be configured as a separate processor module dedicated to controlling laser source 702, optical module 704, and holder 706. Alternatively, processor 804 can be configured as a shared processor module for performing other functions unrelated to controlling laser source 702, optical module 704, and holder 706.

As shown in FIG. 8, processor 804 can include multiple modules, such as a scan pattern determination unit 810, a laser source control unit 812, an optical module control unit 814, a stage control unit 816, and the like. These modules (and any corresponding sub-modules or sub-units) can be hardware units (e.g., portions of an integrated circuit) of processor 804 designed for use with other components or to execute a part of a program. The program can be stored on a computer-readable medium, and when executed by processor 804, it may perform one or more functions. Although FIG. 8 shows units 810-816 all within one processor 804, it is contemplated that these units may be distributed among multiple processors located near or remotely with each other.

Scan pattern determination unit 810 can be configured to determine the scan pattern to be formed by the focused laser spots based on the area/size of treatment area 701. In some implementations, scan pattern determination unit 810 receives data indicative of the size/area of treatment area 701 and determines whether a single focused laser spot or a minimum repeating spot, formed by a plurality of focused laser spots, may be employed. As described above, if the size/area of treatment area 701 is less than or equal to that of a single focused laser spot, a single focused laser spot may be used to anneal treatment area 701. Otherwise, a plurality of focused laser spots may be employed to form a minimum repeating spot for annealing treatment area 701. In some implementations, data indicative of the area/size of treatment area 701 is stored in memory 806 and/or storage 808. In some implementations, data indicative of the area/size of treatment area 701 can be updated to adjust to different designs and fabrication of 3D memory devices. In some implementations, scan pattern determination unit 810 can determine the size and/or shape of a focused laser spot that can form the scan pattern with the desired size and/or shape.

Figure 9:
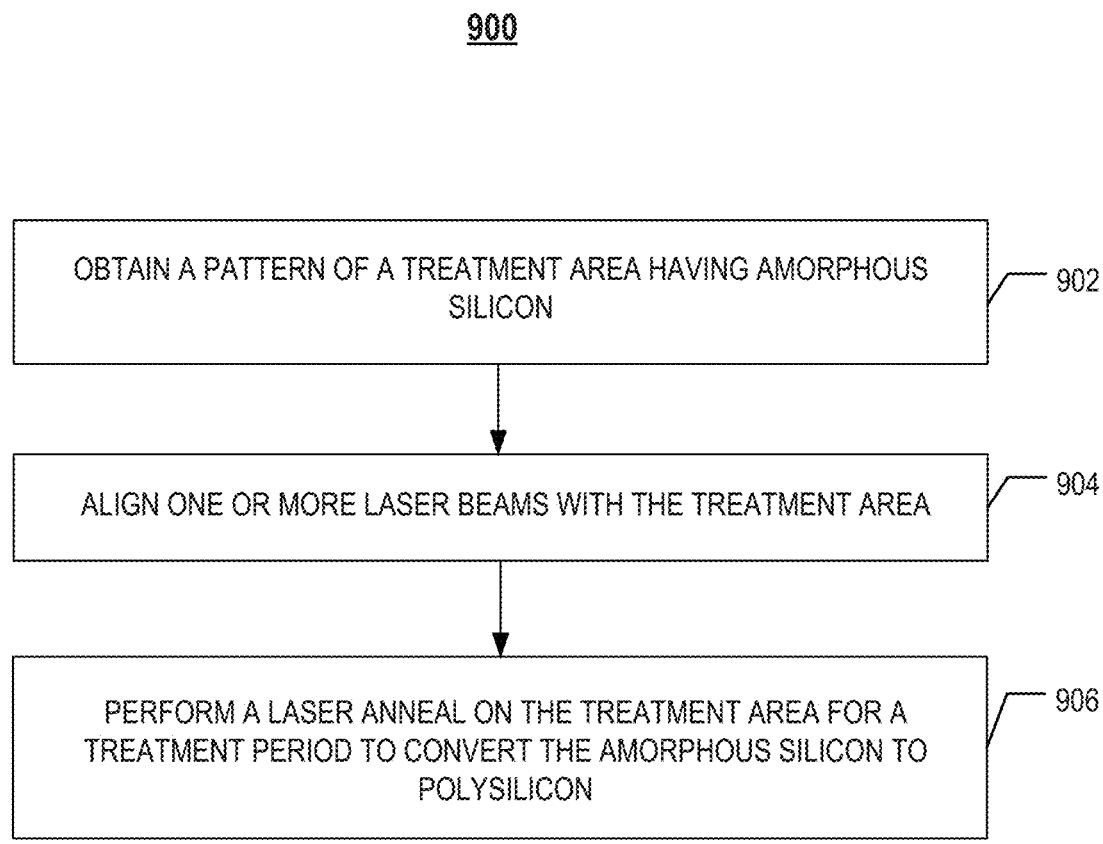
FIG. 9 is a flowchart of an exemplary method for performing a laser anneal on a semiconductor device, according to some aspects of the present disclosure.

FIG. 9 is a flowchart of an exemplary method 900 for operating system 700 to anneal a treatment area, according to some aspects of the present disclosure. FIGS. 4A-4D, 5A-5C, 6A, 6B, 8, and 9 will be described together. It is understood that the operations shown in method 900 are not exhaustive and that other operations can be performed as well before, after, or between any of the illustrated operations. Further, some of the operations may be performed simultaneously, or in a different order than shown in FIG. 9.

Referring to FIG. 9, method 900 starts at operation 902, in which a pattern of a treatment area having amorphous silicon is obtained.

Referring back to FIGS. 7 and 8, controller 708 (e.g., scan pattern determination unit 810) may determine the pattern of a treatment area, which may be part of a wafer or a full wafer positioned on holder 706. In some implementations, data indicative of the pattern, such as shape, area, and dimensions, of treatment area 701 is stored in memory 806 and/or storage 808, which can be accessed by controller 708.

Referring to FIG. 9, method 900 proceeds to operation 904, in which one or more laser beams are aligned with the treatment area.

Referring back to FIGS. 4A-4D, 5A-5C, 6A, 6B, 7, and 8, controller 708 (e.g., optical module control unit 814) may determine the number of laser beams to be emitted for the laser anneal. If the area/size of treatment area 701 is smaller than or equal to the spot area of a focused laser spot, which is also stored as data in memory 806 and/or storage 808, one laser beam may be emitted. If the area/size of treatment area 701 is greater than or equal to the spot area of a focused laser spot, more than one laser beam may be emitted.

Controller 708 (e.g., laser source control unit 812) may control laser source 702 to emit the number of lasers accordingly. Controller 708 (e.g., optical module control unit 814) may control optical module 704 to align the laser beam(s) with treatment area 701 and focus the laser beam(s) on treatment area 701. Controller 708 (e.g., optical module control unit 814) may also control optical module 704 to adjust the energy profile and pattern, e.g., shape, dimensions, and/or area of the focused laser spot(s) formed on treatment area 701. In some implementations, controller 708 (e.g., optical module control unit 814) may also control optical module 704 to align and overlap a plurality of focused laser spots on treatment area 701 to form a minimum repeating spot. Controller 708 (e.g., optical module control unit 814) may further control optical module 704 to move the laser beams/focused laser spots across treatment area 701 such that anneal treatment area 701 can be annealed uniformly. The detailed description of employing focused laser spot(s) to anneal treatment area 701 may be referred to FIGS. 4A-4D, 5A-5C, 6A, and 6B, and is not repeated herein.

Referring to FIG. 9, method 900 proceeds to operation 906, in which a laser anneal is performed on the treatment area for a treatment period to convert the amorphous silicon to polysilicon.

Referring back to FIGS. 4A-4D, 5A-5C, 6A, 6B, 7, and 8, controller 708 (e.g., laser source control unit 812) may control laser source 702 to illuminate laser beam(s) for a treatment period, e.g., at each focused laser spot, such that the area illuminated with the focused laser spot may be annealed. The detailed description of employing focused laser spot(s) to anneal treatment area 701 may be referred to FIGS. 4A-4D, 5A-5C, 6A, and 6B, and is not repeated herein.

In an aspect of the present disclosure, a method for thermal treatment on a semiconductor device is disclosed. The method includes obtaining a pattern of a treatment area having amorphous silicon, aligning a laser beam with the treatment area, the laser beam in a focused laser spot having a spot area equal to or greater than the treatment area, and performing a laser anneal on the treatment area by emitting the laser beam towards the treatment area for a treatment period.

In some implementations, the laser anneal converts the amorphous silicon to polysilicon.

In some implementations, the spot area fully encompasses the treatment area.

In some implementations, the spot area includes a central spot area and a peripheral spot area surrounding the central spot area; and an energy level of the laser beam is constant in the central spot area and decreases in the peripheral spot area.

In some implementations, the central spot area fully encompasses the treatment area.

In some implementations, the treatment area covers a core array region in the semiconductor device, the core array region having a dimension A in a first lateral direction and a dimension B in a second lateral direction perpendicular to the first lateral direction, the central spot area of the spot area having a dimension E in the first lateral direction and a dimension G in the second lateral direction. In some implementations, $(A-E+OVL)\leq 0$ and $(A-E+SLW)\geq 0$, OVL being an overlay error between the focused laser spot and the treatment area, and SLW being a width of a scribe line, and $(B-G+OVL)\leq 0$ and $(B-G+SLW)\geq 0$.

In some implementations, the treatment area covers a core array region and a non-core array region in the semiconductor device, the core array region having a dimension A in the first lateral direction and a dimension B in the second lateral direction, P being a dimension of the non-core array region in the first lateral direction and Q being a dimension of the non-core array region in the second lateral direction, the central spot area of the spot area having a dimension E in the first lateral direction and a dimension G in the second lateral direction. In some implementations, $(mA+jP-E+OVL)\leq 0$ and $(mA+jP-E+SLW)\geq 0$, m being a positive integer, OVL being an overlay error between the focused laser spot and the treatment area, and SLW being a width of a scribe line, and $(nB+kQ-G+OVL)\leq 0$ and $(nB+kQ-G+SLW)\geq 0$, n being a positive integer, j and k each being a non-negative integer.

In some implementations, m is greater than or equal to 2.

In some implementations, the treatment area covers all core array regions and non-core array regions in a die of the semiconductor device.

In some implementations, the treatment area covers all planes in a die of the semiconductor device.

In some implementations, the treatment area covers all dies in a shot of the semiconductor device.

In some implementations, the treatment area covers a wafer, the wafer having a dimension W in the first lateral direction and a dimension V in the second lateral direction, the spot area having a dimension F in the first lateral direction and a dimension H in the second lateral direction perpendicular to the first lateral direction. In some implementations, $F\geq(W+OVL)$, OVL being an overlay error between the focused laser spot and the treatment area, and $H\geq(V+OVL)$.

In some implementations, the treatment area is conductively connected to a pad-out interconnect of the semiconductor device.

In another aspect of the present disclosure, a method for thermal treatment on a semiconductor device is provided. The method includes obtaining a pattern of a treatment area having amorphous silicon, and aligning a plurality of laser beams with the treatment area. The laser beams are each in a focused laser spot having a plurality of spot areas each less than or equal to a treatment area. The method also includes performing a laser anneal on the treatment area by emitting the plurality of laser beams towards the treatment area for a treatment periods to convert the amorphous silicon to polysilicon.

In some implementations, the spot area, having a dimension F in a first lateral direction and a dimension H in a second lateral direction, includes a central spot area and a peripheral spot area surrounding the central spot area. In some implementations, an energy level of the laser beam is constant in the central spot area and decreases in the peripheral spot area, and the central spot area has a dimension E in the first lateral direction and a dimension G in the second lateral direction, E being less than F and G being less than H.

In some implementations, the method further includes overlapping the plurality of spot areas with one another to form a minimum repeating spot, and applying the minimum repeating spot for a plurality of times to cover the treatment area.

In some implementations, the minimum repeating spot causes a laser anneal process on the treatment area in the treatment period.

In some implementations, a number of the plurality of spot areas is four, a lateral dimension of the minimum repeating spot in the first lateral direction is equal to $(F-E)/2$, and a lateral dimension of the minimum repeating spot in the second lateral direction is equal to $(H\times G)/2$.

In some implementations, the treatment area, having a dimension C in the first lateral direction and a dimension D in the second lateral direction, covers a core array region in a semiconductor device, the core array region having a dimension A in the first lateral direction and a dimension B in the second lateral direction. In some implementations, $(mE+OVL)\leq C\leq(mE+SLW)$, OVL being an overlay error between the focused laser spot and the treatment area, and SLW being a width of a scribe line. In some implementations, $(nG+OVL) \leq D \leq (nG+SLW)$, m and n each being an integer.

In some implementations, the treatment area, having a dimension C in the first lateral direction and a dimension D in the second lateral direction, covers a core array region and a non-core array region in a semiconductor device, the core array region having a dimension A in the first lateral direction and a dimension B in the second lateral direction, P being a dimension of the non-core array region in the first lateral direction and Q being a dimension of the non-core array region in the second lateral direction. In some implementations, $(mE+jP+OVL) \leq C \leq (mE+jP+SLW)$, m being a positive integer, OVL being an overlay error between the focused laser spot and the treatment area, and SLW being a width of a scribe line. In some implementations, $(nG+kQ+OVL) \leq D \leq (nG+kQ+SLW)$, n being a positive integer, j and k each being a non-negative integer.

In some implementations, the treatment area covers all core array regions and non-core array regions in a die of the semiconductor device.

In some implementations, the treatment area covers all planes in a die of the semiconductor device.

In some implementations, the treatment area covers all dies in a shot of the semiconductor device.

In some implementations, the treatment area is conductively connected to a pad-out interconnect of the semiconductor device.

Another aspect of the present disclosure provides a system for thermal treatment on a semiconductor device. The system includes a laser source configured to generate one or more laser beams, an optical module configured to provide one or more focused laser spots on a treatment area, and a controller coupled to the optical module. The controller is configured to (i) obtain dimensions of the treatment area, and (ii) control at least the optical module to perform a laser anneal on the treatment area by applying the one or more focused laser spots on treatment area based on a spot area of each of the focused laser spots and the treatment area.

In some implementations, in response to the spot area being equal to or greater than the treatment area, the controller is configured to align a laser beam with the treatment area, and emit the laser beam towards the treatment area for a treatment period.

In some implementations, the laser beam causes a laser anneal process on the treatment area in the treatment period.

In some implementations, the spot area fully encompasses the treatment area.

In some implementations, the spot area, having a dimension F in a first lateral direction and a dimension H in a second lateral direction perpendicular to the first lateral direction, includes a central spot area and a peripheral spot area surrounding the central spot area. The central spot area of the spot area has a dimension E in the first lateral direction and a dimension G in the second lateral direction. In some implementations, an energy level of the laser beam is constant in the central spot area and decreases in the peripheral spot area.

In some implementations, the central spot area fully encompasses the treatment area.

In some implementations, the treatment area covers a core array region in a semiconductor device, the core array region having a dimension A in the first lateral direction and a dimension B in the second lateral direction. In some implementations, $(A-E+OVL) \leq 0 \leq (A-E+SLW)$, OVL being an overlay error between the focused laser spot and the treatment area, and SLW being a width of a scribe line. In some implementations, $(B-G+OVL) \leq 0 \leq (B-G+SLW)$.

In some implementations, the treatment area covers a core array region and a non-core array region in a semiconductor device, the core array region having a dimension A in the first lateral direction and a dimension B in the second lateral direction, P being a dimension of the non-core array region in the first lateral direction and Q being a dimension of the non-core array region in the second lateral direction. In some implementations, $(mA+jP-E+OVL) \leq 0 \leq (mA+jP-E+SLW)$, m being a positive integer, OVL being an overlay error between the focused laser spot and the treatment area, and SLW being a width of a scribe line. In some implementations, $(nB+kQ-G+OVL) \leq 0 \leq (nB+kQ-G+SLW)$, n being a positive integer, j and k each being a non-negative integer.

In some implementations, m is greater than or equal to 2.

In some implementations, the treatment area covers all core array regions and non-core array regions in a die of the semiconductor device.

In some implementations, the treatment area covers all planes in a die of the semiconductor device.

In some implementations, the treatment area covers all dies in a shot of the semiconductor device.

In some implementations, the treatment area covers a wafer, the wafer having a dimension W in the first lateral direction and a dimension V in the second lateral direction. In some implementations, $F \geq (W+OVL)$, OVL being an overlay error between the focused laser spot and the treatment area, and $H \geq (V+OVL)$.

In some implementations, the laser anneal process converts an amorphous silicon layer in the treatment area into a polysilicon layer and activates implants in the treatment area.

In some implementations, in response to the spot area being equal to or less than the treatment area, the controller is configured to align a plurality of laser beams with the treatment area and emit the plurality of laser beams towards the treatment area for a treatment period. The laser beams are each in a focused laser spot having a plurality of spot areas each less than or equal to a treatment area.

In some implementations, the spot area, having a dimension F in a first lateral direction and a dimension H in a second lateral direction perpendicular to the first lateral direction, includes a central spot area and a peripheral spot area surrounding the central spot area. In some implementations, an energy level of the laser beam is constant in the central spot area and decreases in the peripheral spot area, and the central spot area has a dimension E in the first lateral direction and a dimension G in the second lateral direction, E being less than F and G being less than H.

In some implementations, the system further includes overlapping the plurality of spot areas with one another to form a minimum repeating spot, and applying the minimum repeating spot a plurality of times to cover the treatment area.

In some implementations, the minimum repeating spot causes a laser anneal process on the treatment area in the treatment period.

In some implementations, a number of the plurality of spot areas is four, a lateral dimension of the minimum repeating spot in the first lateral direction is equal to $(F-E)/2$, and a lateral dimension of the minimum repeating spot in the second lateral direction is equal to $(H-G)/2$.

In some implementations, the treatment area, having a dimension C in the first lateral direction and a dimension D in the second lateral direction, covers a core array region in a semiconductor device, the core array region having a dimension A in the first lateral direction and a dimension B in the second lateral direction. In some implementations, (mE+OVL)≤C≤(mE+SLW), OVL being an overlay error between the focused laser spot and the treatment area, and SLW being a width of a scribe line. In some implementations, (nG+OVL)≤D≤(nG+SLW), m and n each being an integer.

In some implementations, the treatment area, having a dimension C in the first lateral direction and a dimension D in the second lateral direction, covers a core array region and a non-core array region in a semiconductor device, the core array region having a dimension A in the first lateral direction and a dimension B in the second lateral direction, P being a dimension of the non-core array region in the first lateral direction and Q being a dimension of the non-core array region in the second lateral direction. In some implementations, (mE+jP+OVL)≤F≤(mE+jP+SLW), m being a positive integer, OVL being an overlay error between the focused laser spot and the treatment area, and SLW being a width of a scribe line. In some implementations, (nG+kQ+OVL)≤H≤(nG+kQ+SLW), n being a positive integer, j and k each being a non-negative integer.

In some implementations, the treatment area covers all core array regions and non-core array regions in a die of the semiconductor device.

In some implementations, the treatment area covers all planes in a die of the semiconductor device.

In some implementations, the treatment area covers all dies in a shot of the semiconductor device.

In some implementations, the treatment area is conductively connected to a pad-out interconnect of the semiconductor device.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method for thermal treatment on a semiconductor device, comprising:
    obtaining a pattern of a treatment area comprising amorphous silicon;
    aligning a laser beam with the treatment area, the laser beam in a focused laser spot having a spot area equal to or greater than the treatment area; and
    performing a laser anneal on the treatment area by emitting the laser beam towards the treatment area for a treatment period,
    wherein:
    the spot area comprises a central spot area and a peripheral spot area surrounding the central spot area; and
    a dimension of the spot area is at least related to a dimension of the treatment area, a dimension of the peripheral spot area, and an overlay error.

2. The method of claim 1, wherein the laser anneal converts the amorphous silicon to polysilicon.

3. The method of claim 1, wherein the spot area fully encompasses the treatment area.

4. The method claim 1, wherein:
    an energy level of the laser beam is constant in the central spot area and decreases in the peripheral spot area.

5. The method of claim 4, wherein the central spot area fully encompasses the treatment area.

6. The method of claim 5, wherein the treatment area covers a core array region in the semiconductor device, the core array region having a dimension A in a first lateral direction and a dimension B in a second lateral direction perpendicular to the first lateral direction, the central spot area of the spot area having a dimension E in the first lateral direction and a dimension G in the second lateral direction, and wherein
    (A−E+OVL)≤0 and (A−E+SLW)≥0, OVL being the overlay error between the focused laser spot and the treatment area, and SLW being a width of a scribe line, and
    (B−G+OVL)≤0 and (B−G+SLW)≥0.

7. The method of claim 5, wherein the treatment area covers a core array region and a non-core array region in the semiconductor device, the core array region having a dimension A in a first lateral direction and a dimension B in a second lateral direction, P being a dimension of the non-core array region in the first lateral direction and Q being a dimension of the non-core array region in the second lateral direction, the central spot area of the spot area having a dimension E in the first lateral direction and a dimension G in the second lateral direction, and wherein
    (mA+jP−E+OVL)≤0 and (mA+jP−E+SLW)≥0, m being a positive integer, OVL being the overlay error between the focused laser spot and the treatment area, and SLW being a width of a scribe line, and
    (nB+kQ−G+OVL)≤0 and (nB+kQ−G+SLW)≥0, n being a positive integer, j and k each being a non-negative integer.

8. The method of claim 7, wherein m is greater than or equal to 2.

9. The method of claim 7, wherein the treatment area covers all core array regions and non-core array regions in a die of the semiconductor device.

10. The method of claim 7, wherein the treatment area covers all planes in a die of the semiconductor device.

11. The method of claim 5, wherein the treatment area covers a wafer, the wafer having a dimension W in a first lateral direction and a dimension V in a second lateral direction, the spot area having a dimension F in the first lateral direction and a dimension H in the second lateral direction perpendicular to the first lateral direction, and wherein:
    F≥(W+OVL), OVL being the overlay error between the focused laser spot and the treatment area, and
    H≥(V+OVL).

12. A method for thermal treatment on a semiconductor device, comprising:
    obtaining a pattern of a treatment area comprising amorphous silicon;
    aligning a plurality of laser beams with the treatment area, the laser beams each in a focused laser spot having a plurality of spot areas each less than or equal to a treatment area; and
    performing a laser anneal on the treatment area by emitting the plurality of laser beams towards the treatment area for a treatment period to convert the amorphous silicon to polysilicon,
    wherein:
    a spot area of the plurality of spot areas comprises a central spot area and a peripheral spot area surrounding the central spot area; and
    a dimension of the treatment area is at least related to a dimension of the central spot area, a width of a scribe line, and an overlay error.

13. The method of claim 12, wherein:
the spot area has a dimension F in a first lateral direction and a dimension H in a second lateral direction, and wherein:
an energy level of the laser beam is constant in the central spot area and decreases in the peripheral spot area; and
the central spot area has a dimension E in the first lateral direction and a dimension G in the second lateral direction, E being less than F and G being less than H.

14. The method of claim 12, further comprising:
overlapping the plurality of spot areas with one another to form a minimum repeating spot; and
applying the minimum repeating spot for a plurality of times to cover the treatment area.

15. The method of claim 14, wherein the minimum repeating spot causes a laser anneal process on the treatment area in the treatment period.

16. The method of claim 14, wherein:
a number of the plurality of spot areas is four;
a lateral dimension of the minimum repeating spot in a first lateral direction is equal to $(F-E)/2$; and
a lateral dimension of the minimum repeating spot in a second lateral direction is equal to $(H-G)/2$.

17. The method of claim 14, wherein the treatment area, having a dimension C in a first lateral direction and a dimension D in a second lateral direction, covers a core array region in a semiconductor device, the core array region having a dimension A in the first lateral direction and a dimension B in the second lateral direction, and wherein
$(mE+OVL) \leq C \leq (mE+SLW)$, OVL being the overlay error between the focused laser spot and the treatment area, and SLW being the width of a scribe line, and
$(nG+OVL) \leq D \leq (nG+SLW)$, m and n each being an integer.

18. The method of claim 14, wherein the treatment area, having a dimension C in a first lateral direction and a dimension D in a second lateral direction, covers a core array region and a non-core array region in a semiconductor device, the core array region having a dimension A in the first lateral direction and a dimension B in the second lateral direction, P being a dimension of the non-core array region in the first lateral direction and Q being a dimension of the non-core array region in the second lateral direction, and wherein
$(mE+jP+OVL) \leq C \leq (mE+jP+SLW)$, m being a positive integer, OVL being the overlay error between the focused laser spot and the treatment area, and SLW being the width of a scribe line, and
$(nG+kQ+OVL) \leq D \leq (nG+kQ+SLW)$, n being a positive integer, j and k each being a non-negative integer.

19. The method of claim 18, wherein the treatment area covers all core array regions and non-core array regions in a die of the semiconductor device.

20. A system for thermal treatment on a semiconductor device, comprising:
a laser source configured to generate one or more laser beams;
an optical module configured to provide one or more focused laser spots on a treatment area; and
a controller coupled to the optical module and configured to (i) obtain dimensions of the treatment area, and (ii) control at least the optical module to perform a laser anneal on the treatment area by applying the one or more focused laser spots on treatment area based on a spot area of each of the focused laser spots and the treatment area,
wherein:
the spot area comprises a central spot area and a peripheral spot area surrounding the central spot area; and
a dimension of the spot area is at least related to a dimension of the treatment area, a dimension of the peripheral spot area, and an overlay error.

* * * * *